(12) United States Patent
Hawker et al.

(10) Patent No.: US 9,081,283 B2
(45) Date of Patent: Jul. 14, 2015

(54) SPATIAL AND TEMPORAL CONTROL OF BRUSH FORMATION ON SURFACES

(71) Applicant: The Regents of the University of California, Oakland, CA (US)

(72) Inventors: Craig J. Hawker, Santa Barbara, CA (US); Brett P. Fors, Goleta, CA (US); Justin E. Poelma, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/050,098

(22) Filed: Oct. 9, 2013

(65) Prior Publication Data

US 2014/0099580 A1    Apr. 10, 2014

Related U.S. Application Data

(60) Provisional application No. 61/711,920, filed on Oct. 10, 2012.

(51) Int. Cl.
*G03F 7/20* (2006.01)
*G03F 7/004* (2006.01)

(52) U.S. Cl.
CPC . *G03F 7/20* (2013.01); *G03F 7/004* (2013.01)

(58) Field of Classification Search
CPC .................................. G03F 7/20; G03F 7/004
USPC .............................................. 430/322, 270.1
See application file for complete search history.

(56) References Cited

U.S. PATENT DOCUMENTS 6,423,465 B1 *    7/2002   Hawker et al. ................ 430/203

OTHER PUBLICATIONS

Chen et al., "Patterned polymer brushes", Chemical Society Reviews, 2012, 41(8): 3280-3296.
Fors et al., "Control of a living radical polymerization of methacrylates by light", Angewandte Chemie International Edition, 2012, 51(35): 8850-8853.
Hawker et al., "New polymer synthesis by nitroxide mediated living radical polymerizations," Chemical Reviews, 2001, 101(12): 3661-3688.
Kühnel et al., "Mechanism of methyl esterification of carboxylic acids by trimethylsilyldiazomethane", Angewandte Chemie International Edition, 2007, 46(37): 7075-7078.
Lalevée et al., "Iridium Photocatalysts in Free Radical Photopolymerization under Visible Lights", ACS Macro Letters, 2012, 1.2: 286-290.
Magenau et al., "Electrochemically mediated atom transfer radical polymerization," Science, 2011, 332(6025): 81-84.

(Continued)

*Primary Examiner* — Caleen Sullivan
(74) *Attorney, Agent, or Firm* — Gates & Cooper LLP

(57) ABSTRACT

The invention disclosed herein provides highly efficient methods and materials useful for surface patterning via polymerization reactions. In particular, by using a light-mediated radical polymerization procedure, brush formation from a surface can be regulated spatially by controlling the area of irradiation. In embodiments of the invention, polymer chain length (and/or film thickness) can be effectively controlled by either the amount of time a surface is irradiated with light (temporal control) or by the intensity of light allowed to reach the surface. Such light-mediated control allows artisans to use the disclosed processes to form complex 3-dimensional structures on a variety of surfaces. Moreover, the simplicity of the disclosed polymerization processes allows them to be adapted for use in a wide range of technologies.

12 Claims, 23 Drawing Sheets

(56) References Cited

OTHER PUBLICATIONS

Matyjaszewski et al., "Polymers at interfaces: using atom transfer radical polymerization in the controlled growth of homopolymers and block copolymers from silicon surfaces in the absence of untethered sacrificial initiator", Macromolecules, 1999, 32(26): 8716-8724.

Narayanam et al., "Visible light photoredox catalysis: applications in organic synthesis", Chemical Society Reviews, 2011, 40(1): 102-113.

Nicewicz et al., "Merging photoredox catalysis with organocatalysis: the direct asymmetric alkylation of aldehydes", Science, 2008, 322(5898): 77-80.

Otsu et al., "Role of initiator-transfer agent-terminator (iniferter) in radical polymerizations: Polymer design by organic disulfides as iniferters", Makromol. Chem. Rapid Commun., 1982, 3(2): 127-132.

Spruell et al., "Reactive, multifunctional polymer films through thermal cross-linking of orthogonal click groups", Journal of the American Chemical Society, 2011, 133(41): 16698-16706.

Tanabe et al., "Photocontrolled living polymerizations", Nature materials, 2006 5(6): 467-470.

Ulman, "Formation and structure of self-assembled monolayers", Chemical reviews, 1996, 96(4): 1533-1554.

* cited by examiner

| Entry | MAA:BnMA | $M_n$ [kg mol$^{-1}$] | $M_w/M_n$ |
|---|---|---|---|
| 1 | 10:90 | 21 | 1.24 |
| 2 | 20:80 | 22 | 1.36 |
| 3 | 100:0 | 28 | 1.61 |

[a] Reaction conditions: MAA (0.1–1.0 equiv), BnMA (0–0.90 equiv), 1 (0.005–0.13 mol%), and 2 (0.004 equiv) in DMF (0.37 mL mmol$^{-1}$ of monomer) at room temperature with irradiation from a 50 W fluorescent lamp; for characterization the polymers were methylated after polymerization with TMSCHN$_2$ (TMS = trimethylsilyl) to give the methyl ester.

*FIG. 13*

SPATIAL AND TEMPORAL CONTROL OF BRUSH FORMATION ON SURFACES

REFERENCE TO RELATED APPLICATIONS

This application claims the benefit under 35 U.S.C. Section 119(e) of U.S. Provisional Patent Application Ser. No. 61/711,920, filed on Oct. 10, 2012, entitled "SPATIAL AND TEMPORAL CONTROL OF BRUSH FORMATION ON SURFACES" the contents of which are incorporated herein by reference.

TECHNICAL FIELD

The invention relates to systems and methods for polymer brush formation using polymerization reactions that are controlled by light.

BACKGROUND OF THE INVENTION

The ability to precisely control the molecular weight and molecular weight distributions, as well as gain sequence and architecture control in polymer synthesis is of considerable importance in a variety of technologies. For example, the development of controlled polymerization methods has profoundly changed polymer research with strategies, such as nitroxide-mediated radical polymerization (NMP), atom transfer radical polymerization (ATRP), and reversible addition fragmentation chain transfer polymerization (RAFT), processes that allow the facile synthesis of well-defined polymers that are diverse in both their structure and function (see, e.g. C. J. Hawker, et al. *Chem. Rev.* 2001, 101, 3661-3688).

Understandably, there have been a number of efforts to increase the technical applicability of polymerization processes, for example through strategies to regulate the activation and deactivation steps by using an external stimulus. However, there are few descriptions in the art of this type of regulation being successfully achieved through redox-controlled processes, electrochemical techniques, mechanochemical methods, or the allosteric control of catalysis. One strategy that controls both the initiation and growth exploits the unique aspects of electrochemistry to control the ratio of activator to deactivator in ATRP (see, e.g. A. J. D. Magenau, et al. *Science* 2011, 332, 81-84). With the selective targeting of redox-active catalytic species, this polymerization reaction can be turned "on" and "off" by adjusting parameters such as applied current, potential, and total charge passed. However, all of the conventional approaches in this technology are limited by the complexity of the systems, the use of specialized monomers, the requirement of restrictive equipment and/or a lack of responsive dynamic control.

As with traditional radical polymerization, the most robust and widely used form of regulation is through photo-polymerization. Unfortunately however, the most useful form of external stimuli, light irradiation, has not been successfully used in ATRP reactions (see, e.g. M. Tanabe, et al. *Nat Mater* 2006, 5, 467-470; Y. Kwak, et al. *Macromolecules* 2010, 43, 5180-5183). While some photoinitiatable ATRP reactions have been developed, in these studies, only the initiation step was photocontrolled. Consequently, all subsequent growth steps in such reactions could not be photoregulated. Moreover, attempts to develop polymerization processes that are controllable by UV irradiation have been hampered by poor control and broad molecular weight distributions (see, e.g. T. Otsu, et al. *Makromol. Chem. Rapid Commun.* 1982, 3, 127-132).

An ability to adapt new polymerization processes to the large number of technologies that utilize polymer structures (e.g. three dimensional microfabrication technologies such as photolithography) is highly desirable. For this reason, the development of a photo-controlled radical polymerization process represents a significant breakthrough in this technical field.

SUMMARY OF THE INVENTION

The invention disclosed herein involves a radical polymerization process that is easily and precisely controllable via light. The characteristics of this polymerization process make it a versatile platform for the preparation of a wide variety of functional materials that can be adapted for use in a number of contexts. As discussed in detail below, one powerful application for this new photo-controlled polymerization process is its utilization in surface patterning techniques, such as those used in photolithography. For example, because polymerization reactions only occur in the precise regions where light reaches a substrate, polymeric structures can be readily grown on a substrate simply by modulating light exposure. In this context, conventional tools such as filters, photomasks and the like can be used with this technology in order to modulate the intensity of light that reaches one or more regions of a surface, and in this way, precisely pattern complex 3-dimensional polymeric structures on a variety of substrates.

The invention disclosed herein has a number of embodiments that include methods, materials and systems for making and using polymers that are adhered to a surface, for example brush polymers. Illustrative embodiments of the invention include methods of forming brush polymers on the surface of a substrate using a photo-controlled radical polymerization process. Typically this process comprises the steps of forming a plurality of polymer chains on a substrate (e.g. a glass, a metal or a plastic surface) by coating the substrate with a combination of an initiator that reacts with the monomers in the radical polymerization process to form an intermediate compound capable of linking successively with the monomers to form the polymer chains, the monomers that form polymer chain subunits in the radical polymerization process, and a photoredox catalyst. In this process, reagents are selected so that the polymer chains undergo a radical polymerization process that is reversibly activated in the presence of light and reversibly deactivated in the absence of light. Moreover, reagent use and placement can be controlled in these methods so that, for example, the initiator is uniformly distributed on the substrate. In this context, when one or more regions of the coated substrate is exposed to light, the radical polymerization process is initiated in these regions so that the brush polymers are formed.

The methods of the invention allow precise control of polymeric brush formation so as to form complex three dimensional structures on the surface of a substrate. In typical embodiments of the invention, a location of polymer chain formation on the substrate is controlled by exposing an area or region on the substrate in which polymer growth is desired to light, while simultaneously protecting from light those areas or regions on the substrate where polymer growth is not desired. In this way, different regions of the substrate can be exposed to different amounts of light so as to form a three dimensional pattern on the substrate. Optionally, polymer chain lengths on a region of the substrate are controlled by controlling an amount of time that the region is exposed to light; and/or by controlling an intensity of light that reaches the region. In some embodiments of the invention, the light that activates the radical polymerization process is passed through a filter that modulates the intensity of the light. In certain embodiments, the location of polymer chain formation and/or length of polymer chains on the substrate is controlled using a photomask that comprises a partially opaque plate having holes or transparencies that result in a defined pattern of light exposure on the substrate (which results in a defined pattern of brush polymer formation). The methods disclosed herein can be used to form polymeric materials having a number of desirable qualities including for example, a low polydispersity index. Optionally, for example, polymerization in a region of a substrate is controlled so that the polymer chains in the region that are exposed to a given amount of light exhibit a polydispersity index such that $M_w/M_n$ is between 1.0 and 2.0 (e.g. between 1.05 and 1.5), wherein $M_w$=the weight average molecular weight of the plurality of polymer chains; and $M_n$=the number average molecular weight of the plurality of polymer chains.

Another embodiment of the invention is a composition comprising a substrate and a plurality of polymer chains coupled to the substrate (e.g. in the form of a brush polymer). In this embodiment, the reagents of the composition allow the polymer chains to undergo a radical polymerization process that is activated in the presence of light and deactivated in the absence of light. In typical embodiments, the polymer chains in one or more regions of the substrate that are exposed to a specific amount of light exhibit a polydispersity resulting from the light exposure wherein $M_w/M_n$ is between 1.0 and 2.0, wherein $M_w$=the weight average molecular weight of the plurality of polymer chains; and $M_n$=the number average molecular weight of the plurality of polymer chains. In such compositions of the invention, the plurality of polymer chains can have different lengths in different regions of the substrate so as to form a three dimensional pattern on the substrate. In some embodiments of the invention, the three dimensional pattern comprises repetitive geometric features.

In typical compositions of the invention, the plurality of polymer chains are disposed on the substrate in one or more coatings comprising an initiator that reacts with the monomers in the radical polymerization process to form an intermediate compound capable of linking successively with the monomers to form the polymer chains, and/or monomers that form the polymer chains in the radical polymerization process, and/or a photoredox catalyst. Optionally in such compositions, the initiator is coated on the substrate in a manner that makes it uniformly distributed over the substrate. As disclosed below, the compositions of the invention include a variety of polymeric structures including for example, block copolymers and the like.

Other embodiments of the invention include photolithographic systems and kits. Typically such systems include a substrate coupleable to a plurality of polymer chains designed to undergo a radical polymerization process that is activated in the presence of light and deactivated in the absence of light, a photomask adapted to form a pattern on the substrate, and a controllable light source (e.g. wherein the amount and/or intensity of light produced by the light source is controllable). Embodiments of the invention also provide articles of manufacture and kits for forming brush polymers (e.g. in a photolithograph process). In one illustrative embodiment, the kit includes a substrate in combination with one or more reagents used to form polymers on the substrate (e.g. initiators, monomers, catalysts, solvents and the like) as well as articles useful to control polymer growth, for example a controllable light source, one or more light filters and the like.

BRIEF DESCRIPTION OF THE DRAWINGS

FIG. 13: a schematic and Table showing data on the synthesis of random copolymers and the homopolymer of methacrylic acid (MAA).

DETAILED DESCRIPTION OF THE INVENTION

Figure 1:
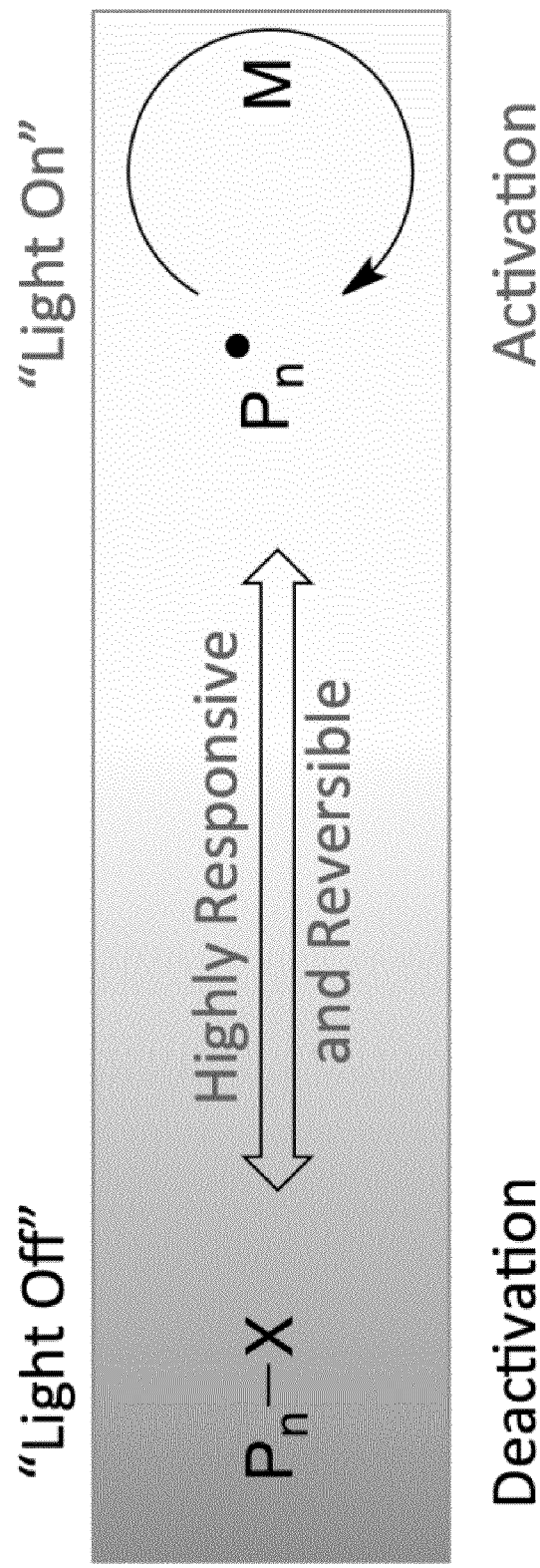
FIG. 1: diagram showing aspects of a polymerization scheme that allows, for example, temporal and spatial control over radical polymerization reactions using light.

Unless otherwise defined, all terms of art, notations and other scientific terms or terminology used herein are intended to have the meanings commonly understood by those of skill in the art to which this invention pertains. In the description of illustrative embodiments, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The invention disclosed herein has a number of embodiments that include methods, materials and systems for making and using polymers that are adhered to a surface/substrate, for example brush polymers. Illustrative embodiments of the invention include methods of forming brush polymers on a substrate using a photo-controlled radical polymerization process. This polymerization process is reversibly activated in the presence of light and reversibly deactivated in the absence of light, and can be activated and/or deactivated multiple times simply by exposing the polymerization reactants to light and/or shielding the polymerization reactants from light. In this context, while a small amount of polymer chain termination may be occurring in these radical polymerization processes, they nonetheless exhibit characteristics of a "living polymerization process" (i.e. an addition polymerization processes where the ability of a growing polymer chain to terminate has been removed). Controlled and living polymerization processes are known in the art and described, for example, in A. H. E. Müller, K. Matyjaszewski, *Controlled and Living Polymerizations*: Methods and Materials, Wiley-VCH, Weinheim, 2009.

Typically, a polymerization process of the invention comprises the steps of forming a plurality of polymer chains on a substrate by coating the substrate with an initiator that reacts with the monomers in the radical polymerization process to form an intermediate compound capable of linking successively with the monomers to form the polymer chains, the monomers that form polymer chain subunits in the radical polymerization process, and a photoredox catalyst. In this process, the reagents are selected so that the polymer chains undergo a radical polymerization process that is reversibly activated in the presence of light and reversibly deactivated in the absence of light. Moreover, reagent use can be controlled in these methods so that, for example, the coating is formed on the substrate so that the initiator is uniformly distributed on the substrate (or a defined area or region of the substrate). In this context, when one or more regions of the coated substrate is exposed to light, the radical polymerization process is initiated in these light exposed regions so that brush polymers are formed.

In illustrative embodiments of the invention, the substrate/surface can comprise a reactive moiety such as a silicon oxide that is first coated with initiator molecules that form a covalent bond with the reactive moiety. In one exemplary embodiment shown in FIG. 6 alkyl bromide functionalized silicon oxide surfaces were synthesized. The excess initiator can then be removed (e.g. rinsed off) prior to combining the functionalized substrate with other reactants. In such embodiments, the substrate can be selected to allow for the formation of uniformly functionalized substrate surface coating. The functionalized substrate can be further coated with monomers and a photoredox catalyst, for example, by placing these reagents in an amount of a solvent placed on top of the functionalized substrate and/or by immersing the functionalized substrate in a solvent containing monomers and a photoredox catalyst. In certain embodiments of the invention, the surface is functionalized with an initiator, the initiator is rinsed off of the functionalized surface, and this functionalized surface is then coated with a solvent that comprises the monomers and the catalysts, but does not comprise any further initiator molecules. This is an unexpected variation of conventional ATRP methodologies, methodologies where sacrificial initiator is often added to the reaction medium, in order to, for example, assist in controlling initiation from the surface. For example, Matyjaszewski et al., Macromolecules 1999, 32, 8716-8724 provides discussions of why sacrificial initiator is conventionally added to surface initiated controlled radical polymerization reactions.

Methods of the invention allow precise control of polymeric brush growth so as to form complex three dimensional structures on the surface of a variety substrates. The illustrative examples disclosed herein use planar substrates in brush formation. However, the spatial and temporal control of surface bound polymers can be adapted for use with substrates having a wide variety of architectures such as non-planar substrates such as spherical, disc-like and rod-like particles. In addition, in typical embodiments of the invention, the initiator is coupled (e.g. covalently linked) to the substrate prior to initiating the polymerization process. A working example of this embodiment is described in Example 1 and shown schematically in FIG. 6. In addition, those of skill in the art understand that a number of well known methods can be used to couple initiators to substrates. See, e.g. Ulman Chem. Rev. 1996, 96, 1533-1554 which describes a variety of strategies for attaching initiators to a surface/substrate; and Spruell et al., J. Am. Chem. Soc. 2011, 133, 16698-16706.

In typical embodiments of the invention, a location of polymer chain formation on the substrate is controlled by exposing an area or region on the substrate in which polymer growth is desired to light, while simultaneously protecting from light those areas or regions on the substrate where polymer growth is not desired. In this way, different regions of the substrate can be exposed to different amounts of light so as to form a three dimensional pattern on the substrate. Illustrative embodiments of the invention include a brush polymer coupled to a substrate and having a three dimensional architecture formed for example, by exposing a first region of the substrate to a first amount of light, a second region of the substrate to a second amount of light, a third region of the substrate to a third amount of light, a fourth region of the substrate to a fourth amount of light etc.

As the rate of polymer formation is shown to be directly proportional to the amount of light exposure in embodiments of the disclosed processes, optionally, for example, polymer chain lengths on a region of the substrate are controlled by controlling an amount of time that the region is exposed to light; and/or by controlling an intensity of light that reaches the region. Embodiments of the invention can comprise exposing a region to light multiple times in order to precisely tailor one or more characteristics of a brush polymer. For example, in some methods of the invention, a region of the coating material is first exposed to light for a period of time so that the radical polymerization process is activated; followed by a step in which this region of the coating material is protected from light exposure for a period of time so that the radical polymerization process is deactivated; and then re-exposing the region of the coating material to light for a period of time so that the radical polymerization process is re-activated etc.

In some embodiments of the invention, the light that activates the radical polymerization process is passed through a filter that modulates the intensity of the light. In certain embodiments, the location of polymer chain formation and/or length of polymer chains on the substrate is controlled using a photomask that comprises a partially opaque plate having holes or transparencies that result in a defined pattern of light exposure on the substrate (which results in a defined pattern of brush polymer formation). The methods disclosed herein can be used to form regions of polymeric materials on the substrate that have a number of desirable qualities including for example, a relatively low polydispersity.

As is known in the art, the polydispersity index (PDI) is a measure of the distribution of molecular mass in a given polymer sample. The PDI calculated is the weight average molecular weight (Mw) divided by the number average molecular weight (Mn). The index indicates the distribution of individual molecular masses in a batch of polymers. The PDI from polymerization is often denoted as: PDI=Mw/Mn, where Mw is the weight average molecular weight and Mn is the number average molecular weight. Optionally in embodiments of the invention, the polymer chain growth in a defined region of a substrate is controlled so that the polymer chains in the defined region that are exposed to a specific amount of light (e.g. a specific frequency of light and/or a specific wavelength of light and/or light having a specific photon energy level and/or a specific power of light) exhibit a polydispersity index such that $M_w/M_n$ is between 1.0 and 2.0 (e.g. 1.05 and 1.5). In certain embodiments of the invention, different regions on a substrate are exposed to different amounts of light and, when examined in aggregate, the polydispersity index of the polymer chains as observed over different regions of the substrate is greater than 2.0, and can be, for example, greater than 5, 10, 25, 50, 100, 150 or 200. In certain embodiments of the invention, different regions on a substrate are exposed to different amounts of light and, when examined in aggregate, the polydispersity index of the polymer chains as observed over multiple different regions on the substrate is less than 2.0, and can be, for example, less than 5, 10, 25, 50, 100, 150 or 200.

The discovery that the light controlled polymerization processes disclosed herein can be used to form brush polymer structures having selected 3-dimensional features on a substrate is surprising for a number of reasons. In particular, the activated photoredox catalysts used in these reactions were expected to likely diffuse through the reaction medium during the polymerization process, thereby producing amorphous clumps of polymeric materials, not selectable discrete 3-dimensional structures. Unexpectedly however, the polymerization processes disclosed herein can be used to form selected architectural features on the surface of a substrate (as shown for example in FIG. 3). Without being bound by any scientific theory or principle, it is believed that the active species of redox catalysts that function in these polymerization processes may have a lifetime in this reaction that prevents diffusion from compromising the operability of the disclosed processes for brush formation. Another surprising finding is that in the processes for polymer brush formation, the rate of polymer formation is directly proportional to the amount of light to which the reaction is exposed. This unexpected finding allows for example, the use of light gradients (e.g. gradients produced by one or more light filters) and the production of finely tailored and graduated polymeric structures, ones whose architectures are directly controlled by an amount light exposure (e.g. by using a photomask that allows different amounts of light to reach different regions of a substrate).

The methods of the invention can be used to form a variety of compositions having various polymeric structures including for example, block copolymers, random copolymers; gradient copolymers; periodic polymers; alternating polymers; statistical polymers; linear polymers; branched polymers; star polymers; brush polymers; comb polymers; graft polymers and the like. One embodiment of the invention is a composition comprising a substrate, a plurality of polymer chains coupled to the substrate (e.g. in the form of a brush polymer). In this embodiment, the reagents of the composition allow the polymer chains to undergo a radical polymerization process that is reversibly activated in the presence of light and reversibly deactivated in the absence of light. As this process is reversibly activated in the presence of light and reversibly deactivated in the absence of light, a polymerization process can be initiated and/or deactivated multiple times simply by exposing the polymerization reactions to light and/or shielding the polymerization reactions from light.

In typical embodiments, the polymer chains in one (or more) region(s) of the substrate (e.g. those exposed to a specific amount of light) exhibit a polydispersity resulting from light exposure wherein $M_w/M_n$ is between 1.0 and 2.0, wherein $M_w$=the weight average molecular weight of the plurality of polymer chains; and $M_n$=the number average molecular weight of the plurality of polymer chains. In such compositions of the invention, the plurality of polymer chains can have different lengths in different regions of the substrate so as to form a three dimensional pattern on the substrate. In some embodiments of the invention, the three dimensional pattern comprises repetitive geometric features (e.g. right angles, lines or rows, rectangles or the like). Embodiments of the invention include the patterning of substrates with block copolymers, and/or fabrication of macromolecular structures through cross-linking of the brushes, followed by their removal from a substrate.

In typical compositions of the invention, the plurality of polymer chains are formed on a substrate within one or more coatings. In some embodiments of the invention, a coating consists essentially of an initiator (e.g. in the absence of a monomer and/or a catalyst). In some embodiments of the invention, a coating does not comprise an initiator and comprises a monomer and/or a solvent, and/or a catalyst. Typically the various coatings in combination include an initiator that reacts with the monomers in the radical polymerization process to form an intermediate compound capable of linking successively with the monomers to form the polymer chains, monomers that form the polymer chains in the radical polymerization process, and a photoredox catalyst. In some embodiments of the invention, the amount of catalyst is less than 20 mol % but more than 0.00001 mol % relative to the amount of monomer used. Optionally in such compositions, the initiator is uniformly distributed on the substrate or a region of the substrate (e.g. a region delineated for polymer growth).

Other embodiments of the invention include photolithographic systems and kits. Typically such systems include a substrate coupleable to a plurality of polymer chains designed to undergo a radical polymerization process that is activated in the presence of light and deactivated in the absence of light, a photomask adapted to form a pattern on the substrate, and a controllable light source (e.g. wherein the amount and/or intensity of light produced by the light source is controllable). Embodiments of the invention also provide articles of manufacture and kits for forming brush polymers (e.g. in a photolithograph process). In one illustrative embodiment, the kit includes a substrate in combination with one or more reagents used to form polymers on the substrate (e.g. monomers, initiators, catalysts, solvents and the like) as well as articles useful to control polymer growth, for example a controllable light source, one or more light filters and the like.

Figure 7:
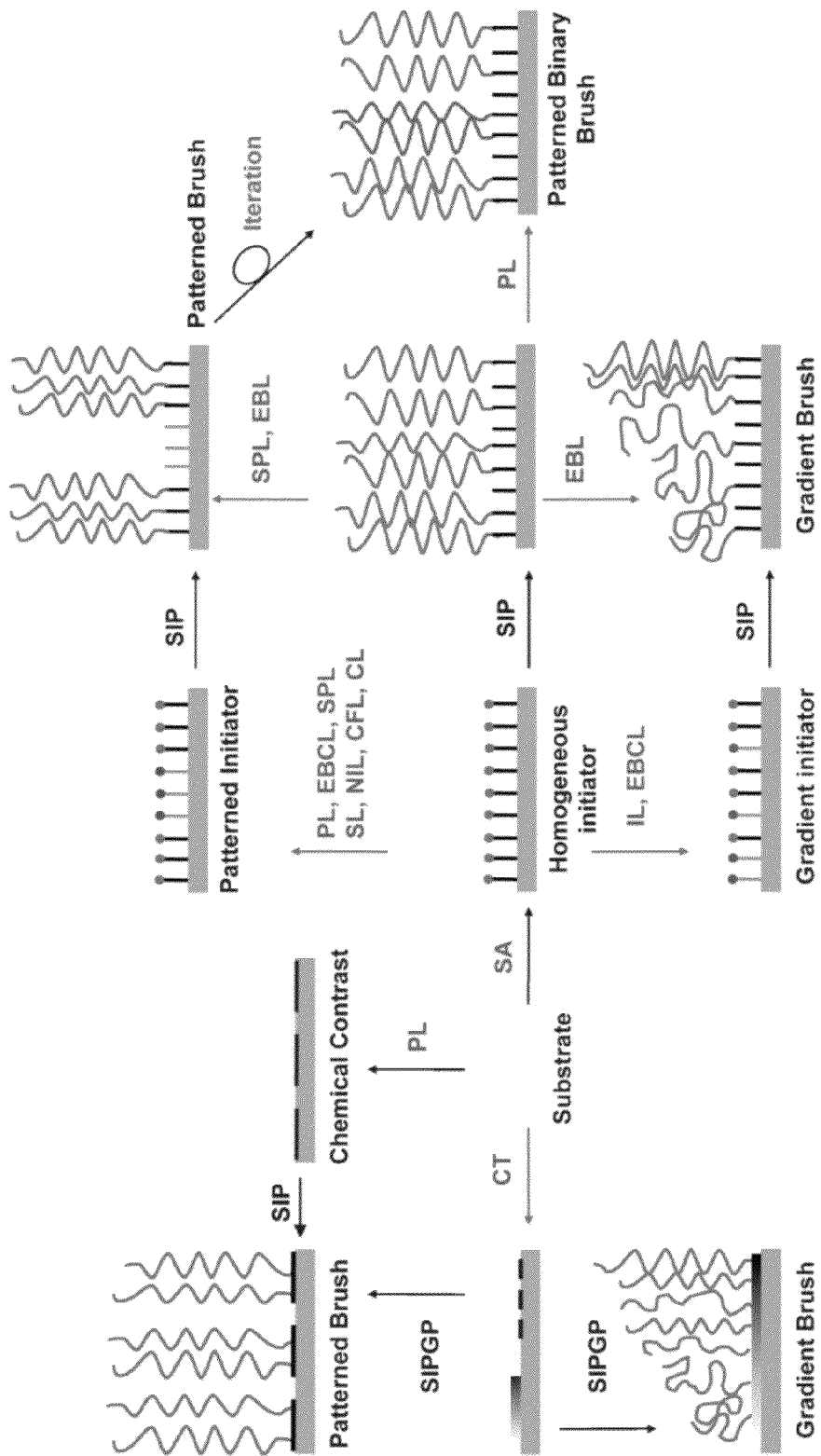
FIG. 7: schematic diagram showing methods for patterning polymer brushes. See, e.g. T. Chen et al., *Chem. Soc. Rev.* 41, 3280-3296 (2012).

Patterned polymer brushes formed via visible-light-mediated surface initiated polymerizations offer many advantages over the prior art. One advantage is the ability to pattern brushes from a uniform initiating layer (where the initiator is uniformly distributed on the substrate or a region of the substrate). This is possible because of the spatial control offered by the light-mediated polymerizations. If spatial control was not possible—as is the case with conventional controlled radical polymerizations—an initiating layer would have to be pre-patterned in order to restrict brush growth to certain regions of a substrate. The complex pre-patterning steps required by conventional methodologies can be accomplished by a variety of techniques (e.g. those shown in FIG. 7 and/or described in T. Chen et al., Chem. Soc. Rev. 41, 3280-3296 (2012)).

An example of a situation where patterning from a uniform layer (e.g. using an embodiment of the invention disclosed herein) is advantageous is multicomponent or "mixed" patterned brushes. Conventionally, mixed patterned brushes would require several steps: patterning initiator, growing polymer A, patterning or backfilling with initiator, growing polymer B, etc. With the advantageous light-mediated systems disclosed herein, the initiator is not irradiated in a first step and therefore can be used to grow a polymer chain with a different chemical identity in a second step without the need to refunctionalize the surface with initiator in the unfilled regions. Consequently these embodiments of the invention require less chemical process steps, characteristics of the invention that make such embodiments more cost effective and environmentally friendly than conventional polymerization processes.

Another advantage of the light-mediated systems disclosed herein is their ability to grow "molecular weight gradients" by irradiating through a mask that varies the intensity of light. This allows for the patterning of gradient structures even on the micron scale. Most gradients in the prior art are formed by varying the density of the initiator on the surface. The chains further away from one another are less stretched than the more dense side of the gradient (see FIG. 7). Molecular weight gradients can be produced using the prior art but would rely on varying the amount of time the monomer solution is in contact with the substrate. For example, this can be achieved by slowly filling a vial with monomer. The monomers come in contact with the bottom of the substrate first giving higher molecular weights there versus the top of the substrate. These characteristics allow artisans to make complex and arbitrary features (e.g. lenses) that cannot be formed using conventional polymerization methodologies.

In summary, a new controlled radical polymerization which is adapted for brush formation and which displays an unprecedented response to activation and deactivation of polymerization through external visible light stimulation is disclosed herein. The advantages of this approach lie in its highly responsive nature, facile reaction setup, use of only ppm levels of catalyst, and excellent functional group tolerance. In analogy with the pervasive nature of traditional photopolymerization and ATRP procedures, this photocontrolled radical polymerization offers a versatile platform for the preparation of functional materials with applications in sustainability, electronics, and health. A number of illustrative and working embodiments of the invention and/or methods and materials that can be used with embodiments of the invention are discussed below.

Illustrative Reagents Useful with Embodiments of the Invention

As is known in the art, reagents in ATRP can be selected to modulate aspects of these polymerization reactions. These include monomers, initiators, catalysts, and solvents. Reactions with these compounds can then be carried out on a variety of substrates, for example a glass substrate, a ceramic substrate, a metallic substrate, a plastic substrate or the like. Moreover, such reactions are typically carried out in a solvent. As is known in the art, the solvent component of a solution is present in the greatest amount and is the substance in which the solutes are dissolved. Embodiments of the invention can be adapted for use with a variety of solvents known in the art, for example dimethyl formamide (DMF), toluene, 1,4-dioxane, xylene, anisole, DMSO, Tetrahydrofuran (THF), water, methanol, acetonitrile, chloroform and the like. In addition, in some embodiments of the invention, one or more reactants in the polymerization process (e.g. a monomer) functions a solvent. In certain working embodiments of the invention, the amounts of monomer present in the reaction mix are greater than the amounts of DMF present in the reaction mix.

As discussed above, an initiator reacts with the monomers in a radical polymerization process to form an intermediate compound capable of linking successively with the monomers to form the polymer chains. In this context, the number of growing polymer chains can be determined by the initiator. The faster the initiation, the fewer terminations and transfers, the more consistent the number of propagating chains leading to narrow molecular weight distributions.

Organic halides can be used as initiators in ATRP processes of the invention. Initiators for ATRP in common embodiments of the invention are typically alkyl halides. Alkyl halides such as alkyl bromides are more reactive than alkyl chlorides. In some embodiments of the invention, the shape or structure of an initiator can be selected to influence the architecture of a polymer. For example, initiators with multiple alkyl halide groups on a single core can lead to a star-like polymer shape. Initiators other than alkyl halide or pseudohalide that can be used in embodiments of the invention include, but are not limited to, xanthates, thioesters, thionoesters, dithioesters, trithioesters, and nitroxides. Illustrative initiators other than ethyl α-bromophenylacetate that can be used in embodiments of the invention include but are not limited to,

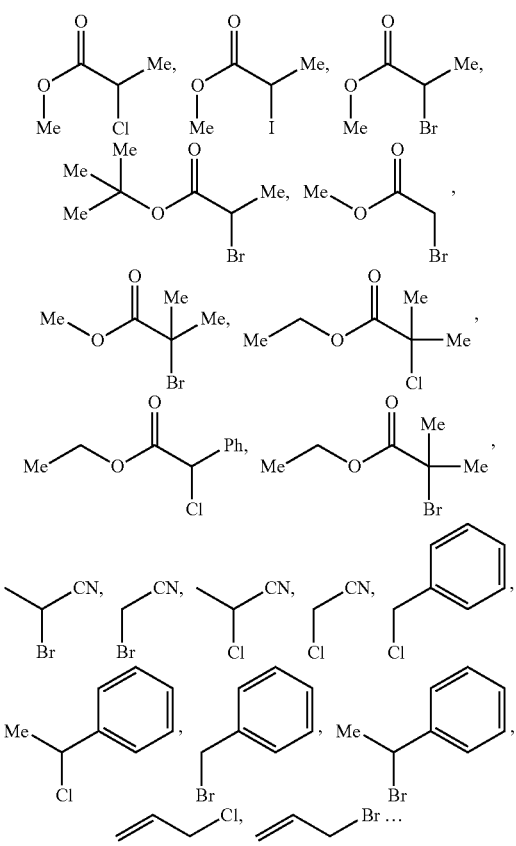

As is known in the art, monomers encompass a class of compounds, mostly organic, that can react with other molecules of the same or other compound to form very large molecules, or polymers. Monomers that are typically used in Atom Transfer Radical Polymerization reactions are molecules with substituents that can stabilize the propagating radicals; for example, styrenes, (meth)acrylates, (meth)acrylamides, and acrylonitrile. ATRP can be used to form polymers of high number average molecular weight and a narrow polydispersity index when the concentration of the propagating radical balances the rate of radical termination. Monomers that undergo radical polymerization in the disclosed process include but are not limited to typical alkene monomers that undergo traditional radical polymerization, such as but not limited to, methyl methacrylate, styrenes, acrylates, methyl acrylate, acrylonitrile, vinyl acetate, vinylpyridine, methacrylic acid, tert-butyl methacrylate, benzyl methacrylate, tert-butyl acrylate, benzyl acrylate, vinyl chloride, acrylamides, acrylic acid. Reactive functional groups, include but are not limited to, carboxylic acids, epoxides, amines, amides, alcohols, ketones, aldehydes, alkynes, alkenes, fluorides, chlorides, bromides, iodides, ethers, esters, hyroxylamines, imines, azides, nitriles, isocyanates, isocyanides, nitrites, nitrosos, thiols, thioethers, sulfoxides, sulfonic acids, thiocyanates, isothiocyanates, thiones, thials, phosphines, phosphonic acids, phosphates, boronic acid, boronic esters, borinic acids, hetroaromatics, and heterocycles.

As is known in the art, a catalyst is a substance that increases the rate of a chemical reaction by reducing the activation energy, but which is left unchanged by the reaction. Various catalysts can be adapted for use with embodiments of the invention. For example, the catalyst in the ATRP reactions can be selected to control the equilibrium constant between the active and dormant species. This equilibrium determines the polymerization rate. Catalysts selected to have a small equilibrium constant can be used in contexts where it is desirable to inhibit or slow the polymerization reaction while catalysts selected to have a large equilibrium constant can be used in contexts where it is desirable to have a high distribution of chain lengths. In typical embodiments of the invention, the catalyst is a metal photoredox catalyst. For a review of photoredox catalysts see J. M. R. Narayanam, et al. Chem. Soc. Rev. 2011, 40, 102-113.

In one embodiment, the photoredox catalyst is selected from a group consisting of transition metal complexes. In certain embodiments, the amount of catalyst is less than 20 mol % but more than 0.00001 mol % relative to the amount of monomer used. In one particular embodiment, the photoredox catalyst is fac-Ir(ppy)$_3$. Photoredox catalysts other than fac-Ir(ppy)$_3$ may also be used, which include but are not limited to:

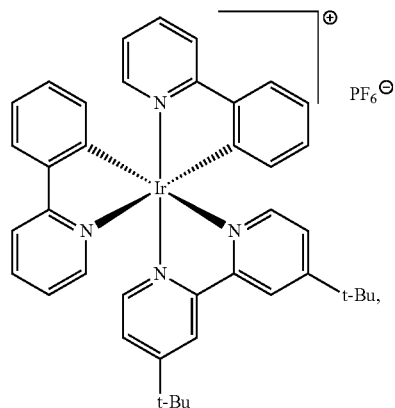

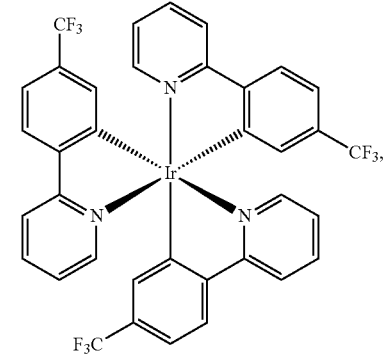

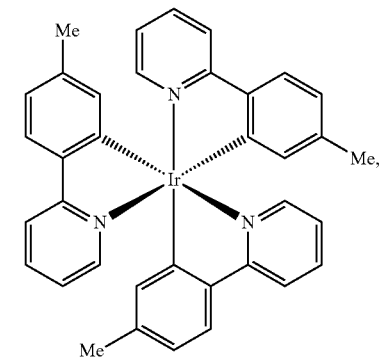

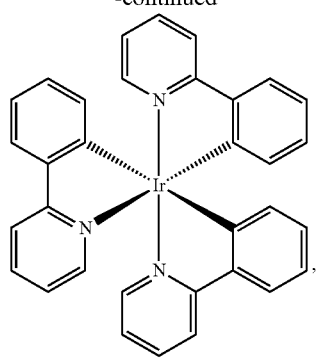
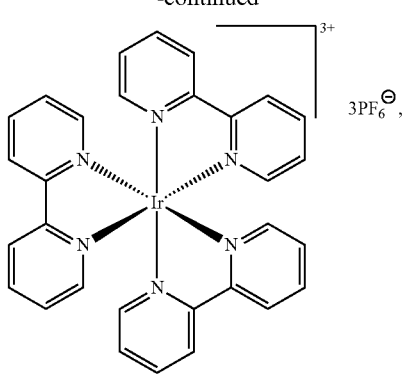
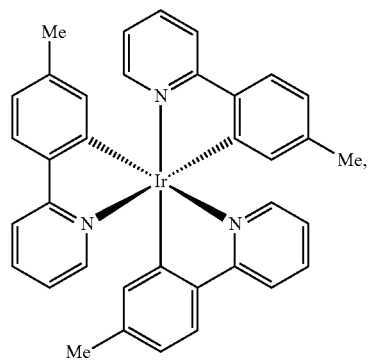
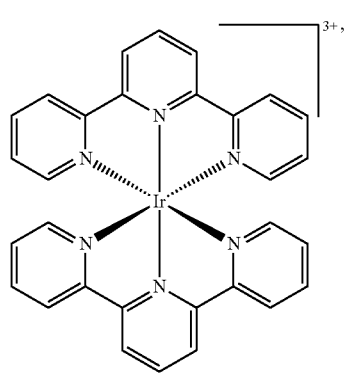
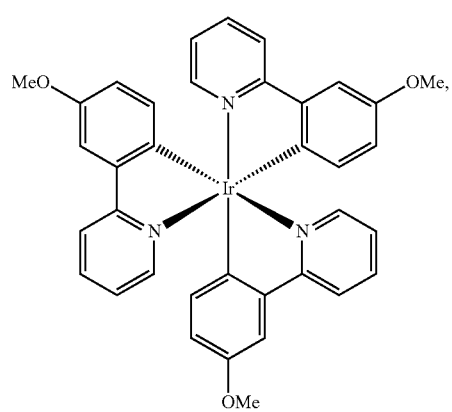
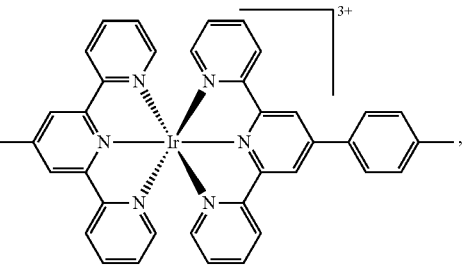
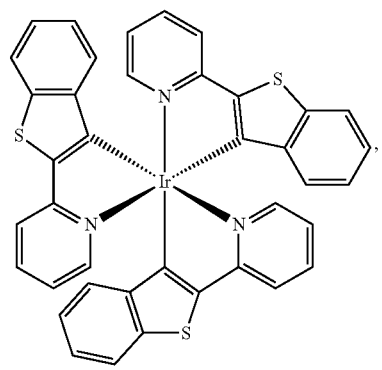
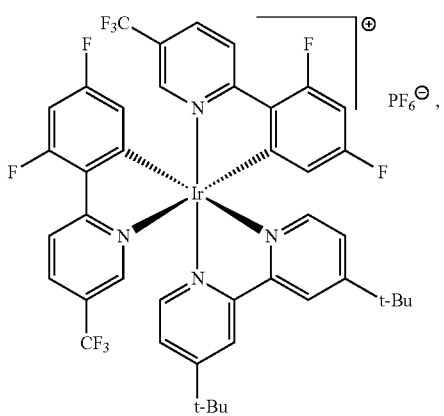

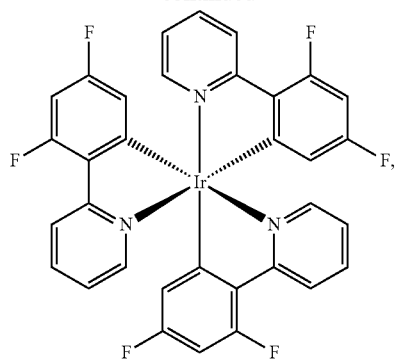
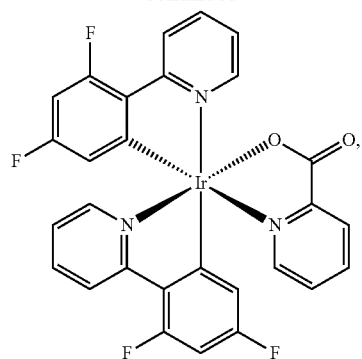
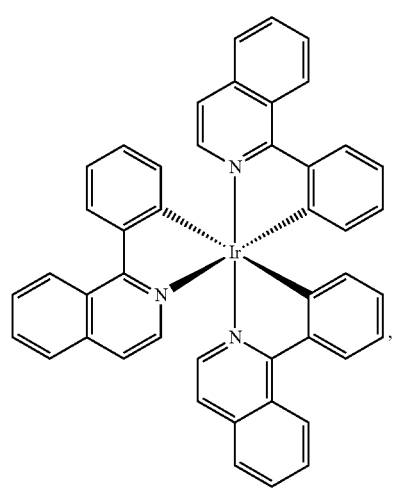
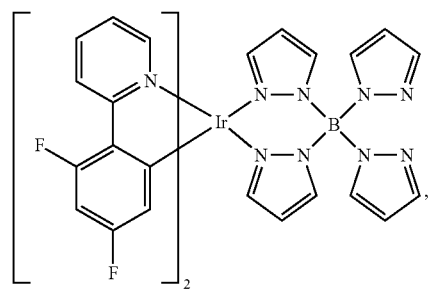
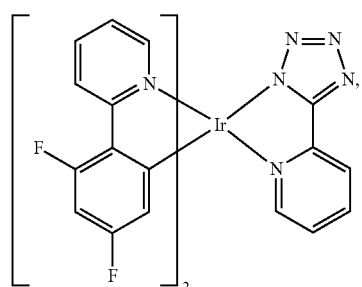
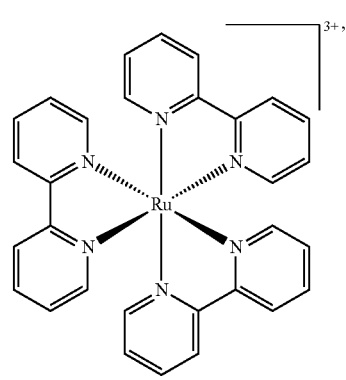
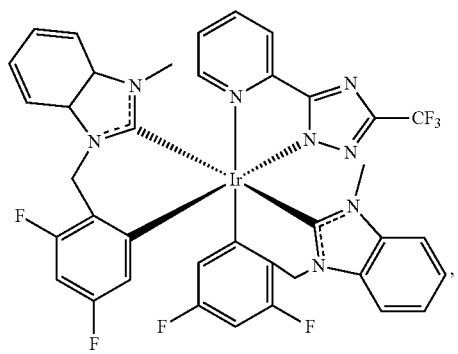
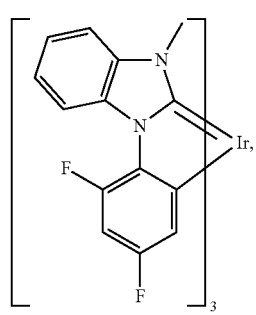
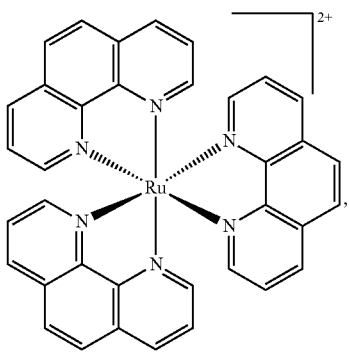

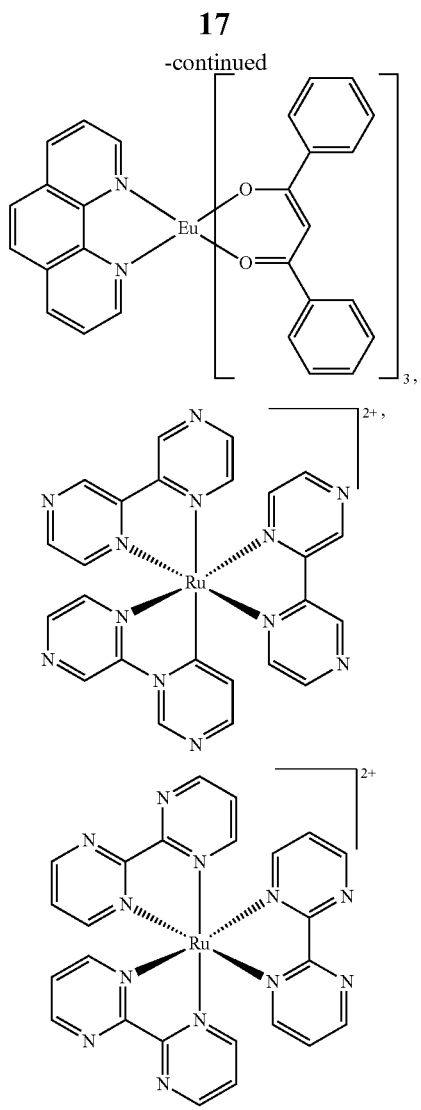
Selected photoredox catalysts can include structures of the type $ML^1L^2L^3$, where $L^1$, $L^2$, and $L^3$ can be but are not limited to,
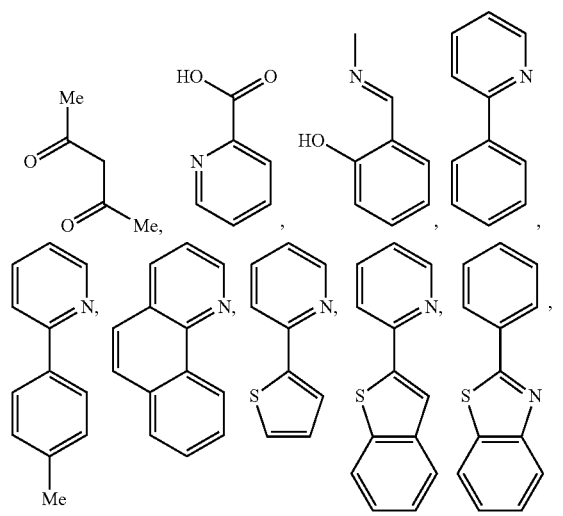
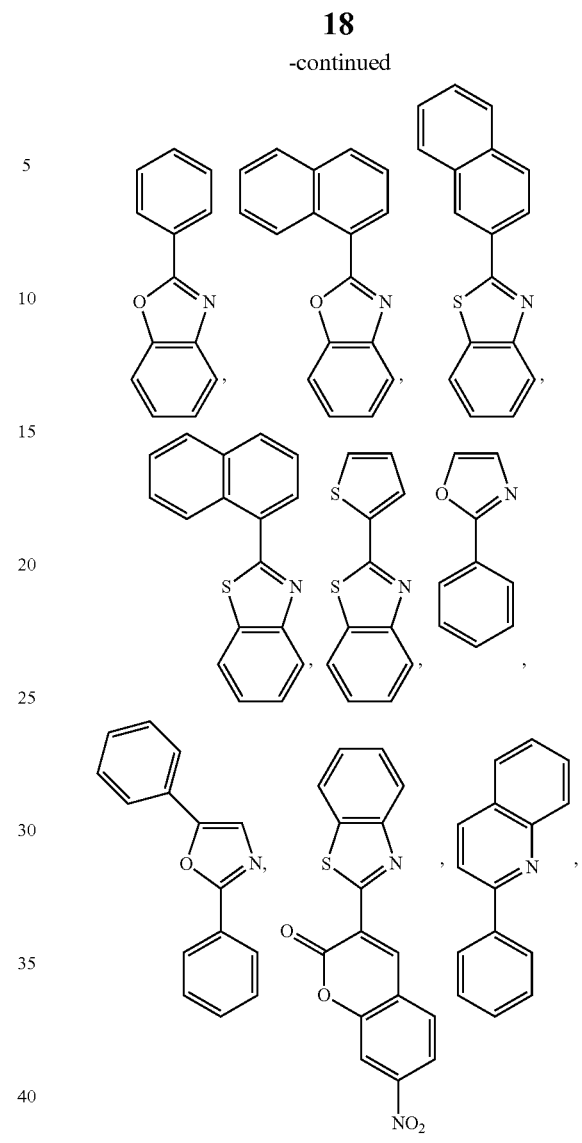
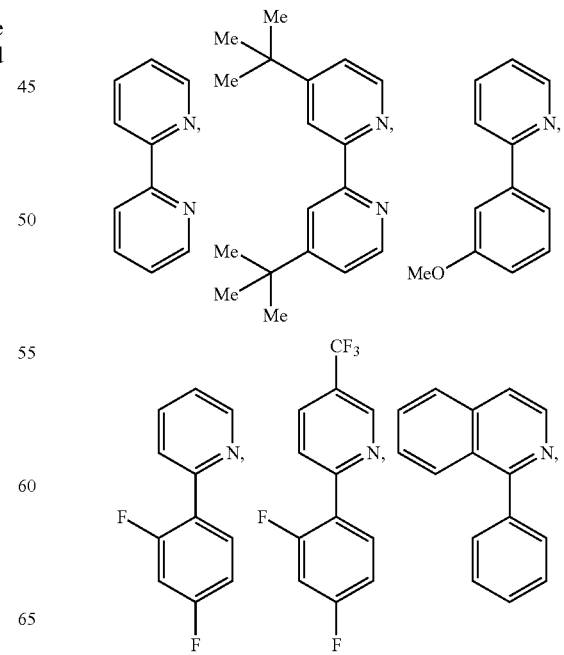

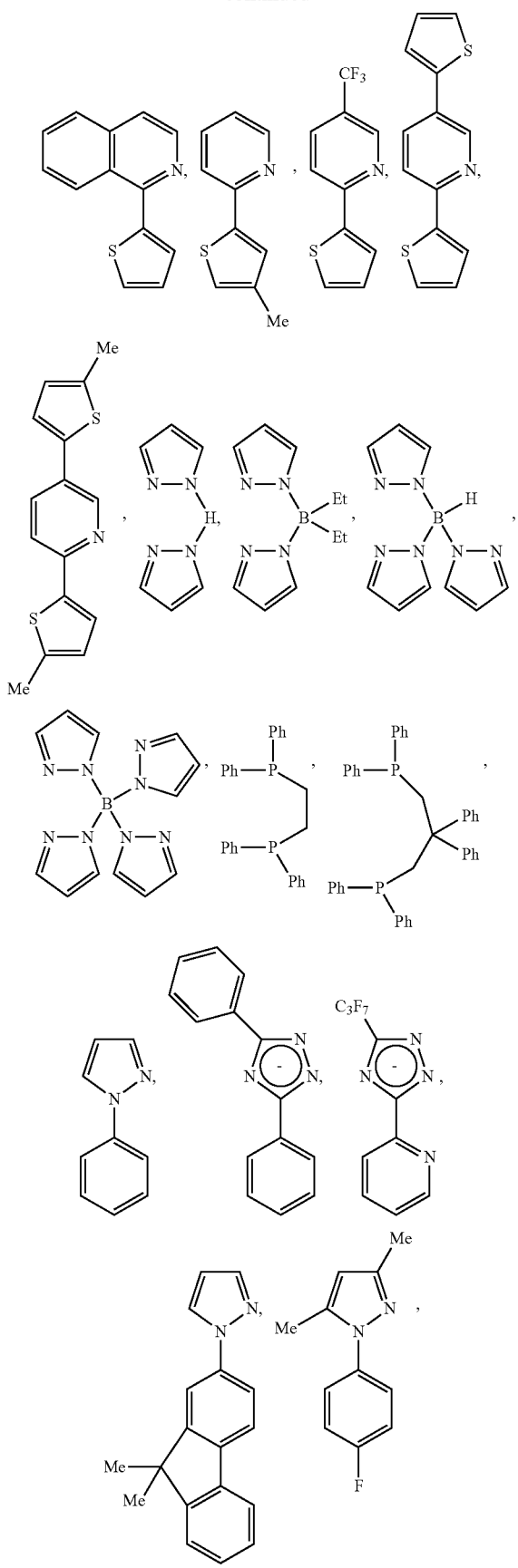
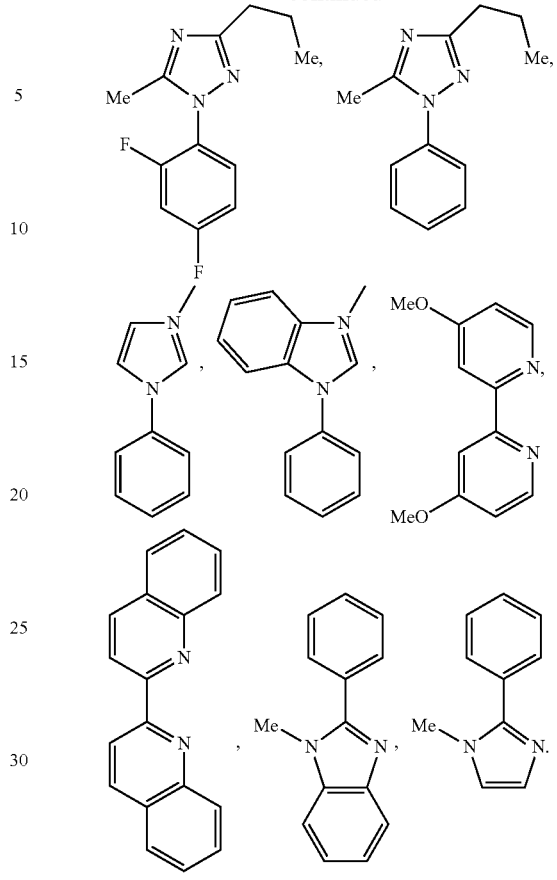

Transition metals other than Ir and Ru that can be used as part of a selected photoredox catalyst complex include, but are not limited to, Co, Fe, Rh, Pt, Pd, Os, Eu, Cu, Al, Ti, Zn, Cd.

Photoredox catalysts are well known in the art (see, e.g. D. A. Nicewicz, et al. *Science* 2008, 322, 77-80). However, such catalysts have been used only for specific aspects of the polymerization process and not the whole process. Moreover, they have only been successful as photoinitiators, employing light to initiate the reactions and not as a means to have precise control over the chain growth process of radical polymerizations, reversibly mediating initiation, polymerization and deactivation steps (see, e.g. Lalevee et al., ACS MACRO LETT., 286-290 (2012).

As disclosed herein, the unique properties of these photoredox catalysts can now be used in systems and methods of highly responsive photocontrolled radical polymerization. By taking advantage of the unique properties that photoredox catalysts display, a free radical polymerization method and system is provided that can be efficiently controlled (e.g., reversibly activated/deactivated) by an external stimulus (light) with all of the desired attributes described above. Notably, this invention requires sub-stoichiometric levels of a photoredox catalyst, has an uncomplicated and easy process setup, and is tolerant of reactive functional groups, such as carboxylic acids, epoxides, amines, etc, because of the robust nature of these catalysts. Because these functional groups have been shown to interfere with other radical procedures, this invention is highly attractive and has widespread application in a number of fields.

In one illustrative aspect of the present invention, an exemplary photoredox mechanism for the controlled radical polymerization is shown in FIG. 1. Photoredox catalysts (M, FIG. 1) have been shown to absorb light to afford a complex in the excited state (M(n)*) (This excited M(n)* species reduces the alkyl halide or pseudohalide to give the desired alkyl radical, which undergoes polymerization with an alkene monomer that is chosen from typical alkene monomers that undergo traditional radical polymerization. The highly oxidizing M(n+1) complex then reacts with the alkyl radical to afford the initial M(n) complex in the ground state, as well as an alkyl halide/pseudo halide capped polymer. In certain embodiments, this process is repeated with the aid of an additional photon of light The oxidation of the radical to form the alkyl halide/pseudo halide chain end gives rise to a controlled and radical polymerization process.

Notably, this results in a photochemically controlled, ATRP-like process. However, an advantage of this type of system, and one reason that sets it apart from traditional Cu-mediated ATRP methods, is the ability to reversibly activate or reversibly deactivate the polymerization with visible light. Specifically, when light is removed from this reaction no M(n)* will be present, therefore, the radical chain ends will be oxidized and the reaction will rest at the dormant and stable alkyl halide/pseudo halide species. Furthermore, upon re-exposure to light, M(n)* will be formed, re-activating the polymerization.

Figure 11:
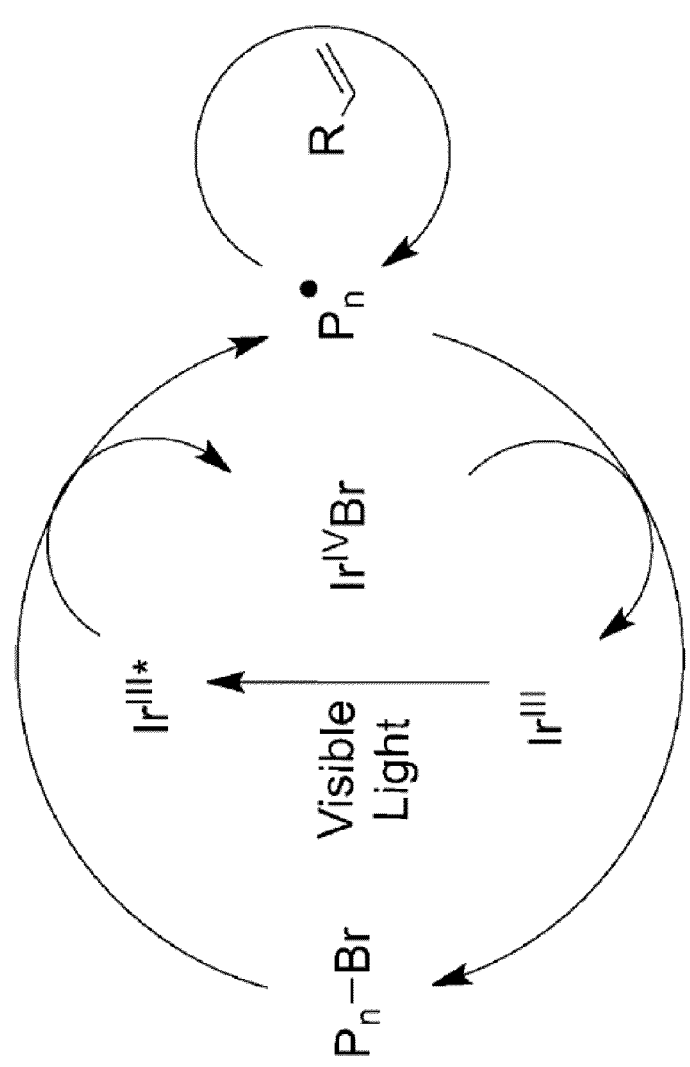
FIG. 11: a schematic of a proposed mechanism of a visible-light-mediated radical polymerization using an Ir-based photoredox catalyst. $P_n$=polymer chain.

Various metals can be used in the design of the photoredox catalyst, with Ir and Ru being two examples. In one illustrative embodiment, the mechanism for photocontrolled radical polymerization is shown in FIG. 11. Fac-[Ir(ppy)$_3$], a commercially available complex, has been shown to absorb visible light to afford fac-[Ir(ppy)$_3$]*. This excited Ir$^{III}$* species reduces an alkyl bromide initiator to give the desired alkyl radical, which initiates polymerization of the monomer. The highly oxidizing Ir$^{IV}$ complex then reacts with the propagating radical to afford the initial Ir$^{III}$ complex in the ground state, as well as a dormant polymer chain with a bromo end group. Having regenerated the starting Ir$^{III}$ complex, homolysis of the C—Br bond, addition of monomer to the radical chain end and recapping with bromide thus occurs with the overall cyclic process being mediated by visible light. When light is removed from this reaction, no Ir$^{III}$* will be present, and the polymerization will rest at the dormant and stable bromo chain-terminated species. Furthermore, upon reexposure to visible light, Ir$^{III}$* is formed, reactivating the polymerization and allowing for true control over polymer structure and architecture.

Illustrative Methods and Materials Useful in Light Mediated Controlled Radical Polymerization Reactions All publications cited herein are hereby incorporated by reference. Certain methods, materials and polymerization processes discussed below are disclosed in Fors et al., Angewandte Chemie Volume 51, Issue 35, pages 8850-8853 (2012). As disclosed herein, it has been discovered that it is possible to modify and manipulate these polymerization processes in a manner that allows them to be used to form complex 3-dimensional polymer brush structures on substrates. Unexpectedly, these 3-dimensional structures not only form on a substrate but further can be designed to include a wide variety of selected architectural features (see, e.g., the ordered rectangular structures shown in FIG. 3). Moreover, it has been discovered that the rate of polymer brush formation in these processes is directly proportional to the amount of light to which the reaction is exposed, an unexpected characteristic that allows artisans to use light to easily and precisely control the geometry of the polymer brush structures.

Figure 12:
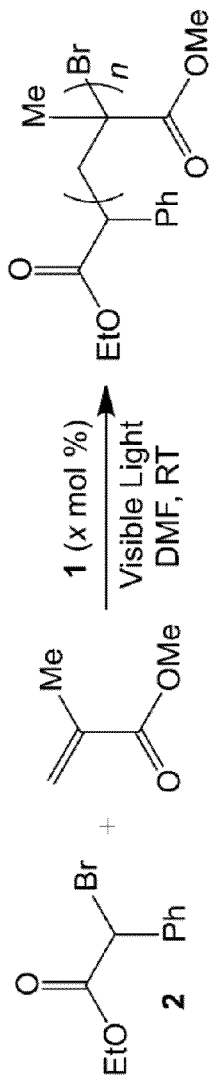
FIG. 12: a schematic and Table showing data on molecular weight and polydispersities for the visible-light-mediated polymerization of methyl methacrylate using [Ir(ppy)$_3$].

As disclosed in Fors et al., Angewandte Chemie Volume 51, Issue 35, pages 8850-8853 (2012), the polymerization of methyl methacrylate (MMA) was examined by using the Ir complex 1 as the catalyst, ethyl-α-bromophenylacetate as the initiator, and a 50 W fluorescent lamp as the light source. In keeping with the simple, user friendly nature of traditional ATRP, complex 1 was selected for preliminary studies owing to its stability, highly reducing nature, and commercial availability. Encouragingly, initial results employing 0.2 mol % catalyst did afford polymer; however, the reaction displayed little to no control, with a $M_w/M_n$ value of 2.76 (FIG. 12, entry 1). It was reasoned that photoredox catalyst 1 was only acting as an initiator in this reaction, and to gain control over this system the radical concentrations needed to be lowered, which could be achieved by simply reducing the catalyst loading. In support of this hypothesis, it was found that significantly decreasing the loading from 1 to 0.005 mol % led to excellent control over the polymerization with a molecular weight distribution of 1.25 being obtained (FIG. 12, entry 2); this low catalyst loading is a highly desirable feature. Further, under the optimized reaction conditions, subsequent polymerizations demonstrated that the molecular weight of the polymer could be efficiently controlled by changing the monomer/initiator ratio with close agreement between the experimental and theoretical molecular weights (FIG. 12, entries 2-5).

To confirm the proposed mechanism, control polymerizations were conducted without added catalyst or in the absence of light, and in both examples no reaction was observed (FIG. 12, entries 6 and 7). Additional supporting evidence was obtained through fluorescence studies. When 1 was combined with various concentrations of MMA, no change in the fluorescence of the Ir complex was detected. However, when the same experiment was performed with the initiator, ethyl-α-bromophenylacetate, a concentration-dependent fluorescence quenching was observed. These results suggest that the excited Ir$^{III}$* complex is undergoing a redox process with the initiator and not reacting with the monomer.

Figure 9:
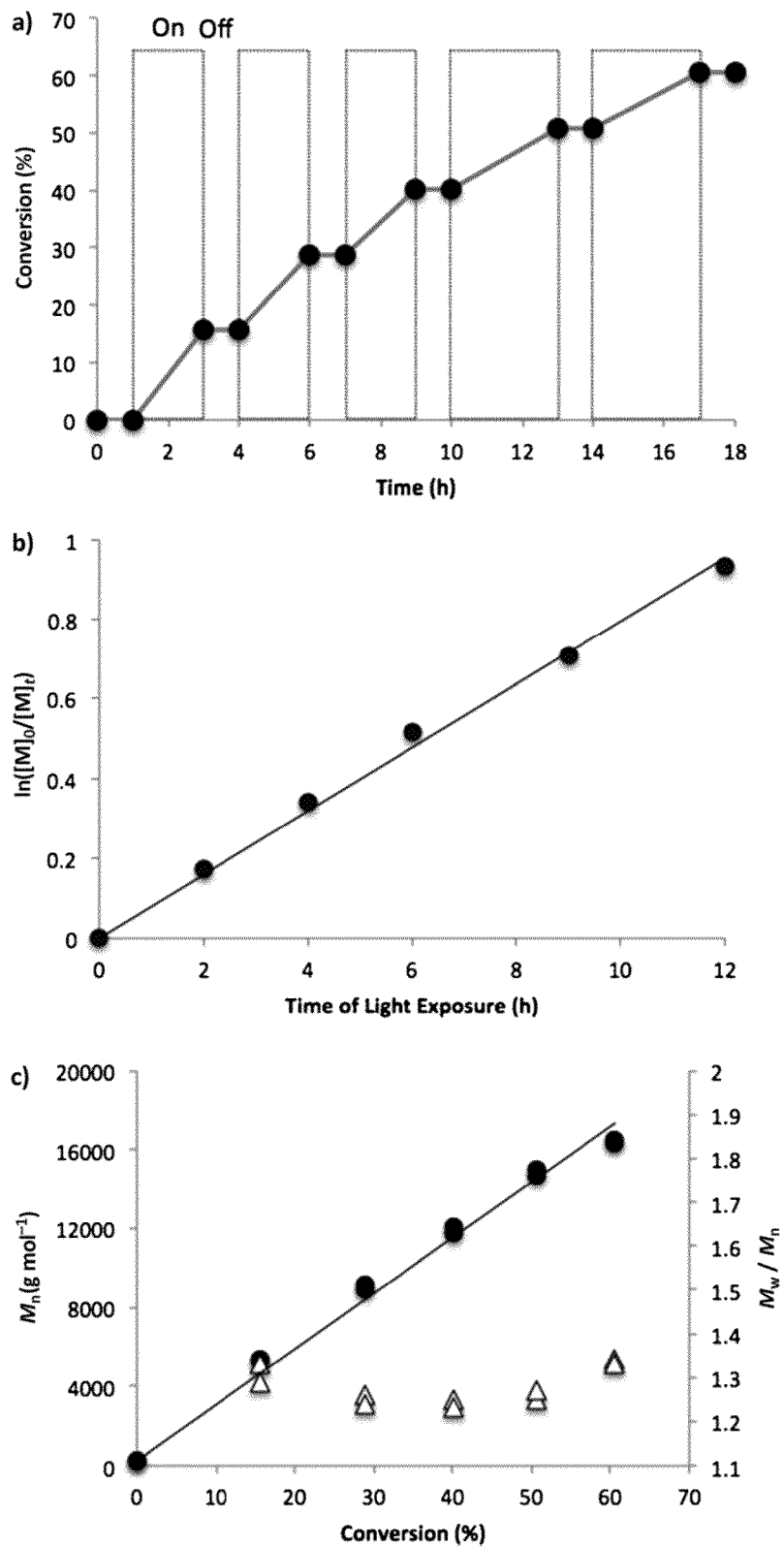
FIG. 9: graphs showing the polymerization of MMA using catalyst 1 while cycling the reaction's exposure to visible light. (A) Conversion vs. time; (B) time of light exposure vs. $\ln([M]_0/[M]_t)$, with $[M]_0$ and $[M]_t$ being the concentrations of monomers at time points zero and t, respectively; (C) conversion vs. $M_n$ (●) and conversion vs. $M_w/M_n$ (△).

The lack of any reaction in the absence of visible light suggests that a true "on"-"off" photopolymerization system could be developed. To demonstrate this possibility, monomer, initiator, and catalyst were initially combined in the absence of light and after one hour no polymerization was observed. The reaction was then exposed to visible light for two hours at room temperature, which resulted in approximately 15% monomer conversion. In demonstrating true temporal control, removal of the light source stops the polymerization immediately and no conversion was observed during the dark period (1 hour). Exposure to light for a second two-hour period "turns" the polymerization back on and this "on"/"off" cycle can be repeated numerous times without observable reaction in the absence of irradiation (FIG. 9a). These results demonstrate that this system is highly responsive to the external stimulus and when light is removed from the system polymerization stops almost immediately. This high degree of temporal control illustrates the efficient nature of the fac-[Ir(ppy)$_3$] catalyst for reversible activation and deactivation of the bromo chain end.

To clearly demonstrate that existing chain ends are reactivated during these "on"/"off" cycles with no new chains being initiated during the polymerization, plots of ln([M]$_0$/[M]$_t$) versus total exposure time (FIG. 9b), and $M_n$ versus conversion (FIG. 9c) both gave linear relationships. Significantly, this data proves that when the light is turned off and polymerization stops, termination of the chain ends is not occurring and in the absence of light, the dormant species is the stable bromo chain end. In analogy with traditional ATRP, when these dormant chain ends are reexposed to light in the presence of the iridium catalyst, efficient reactivation of the chain ends is achieved. These features demonstrate that this process is a photocontrolled radical polymerization, which is highly responsive to visible light as an external stimulus (the reaction has been kept in the dark for up to five hours without any observed loss of the active reversible nature of the polymerization process).

Figure 10:
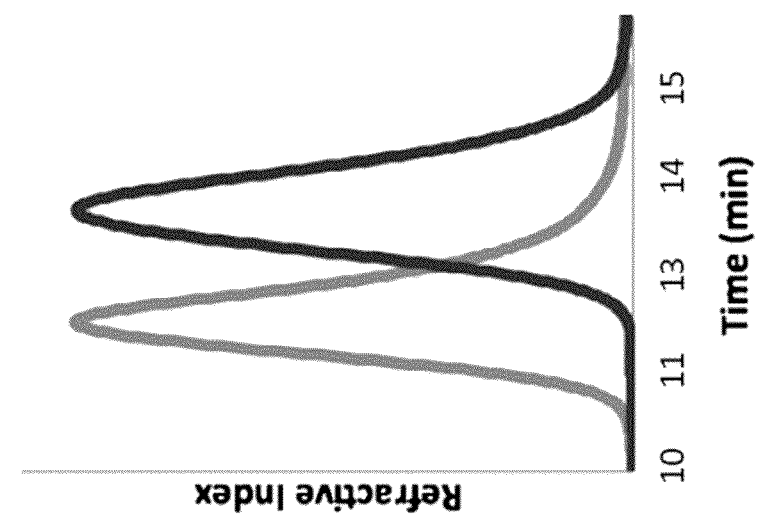
FIG. 10: diagram showing synthesis of a poly(methyl methacrylate)-b-(benzyl methacrylate) diblock copolymer and graphed data from a size exclusion chromatogram with the gray and black traces corresponding to 4 and 3, respectively.
Figure 10:
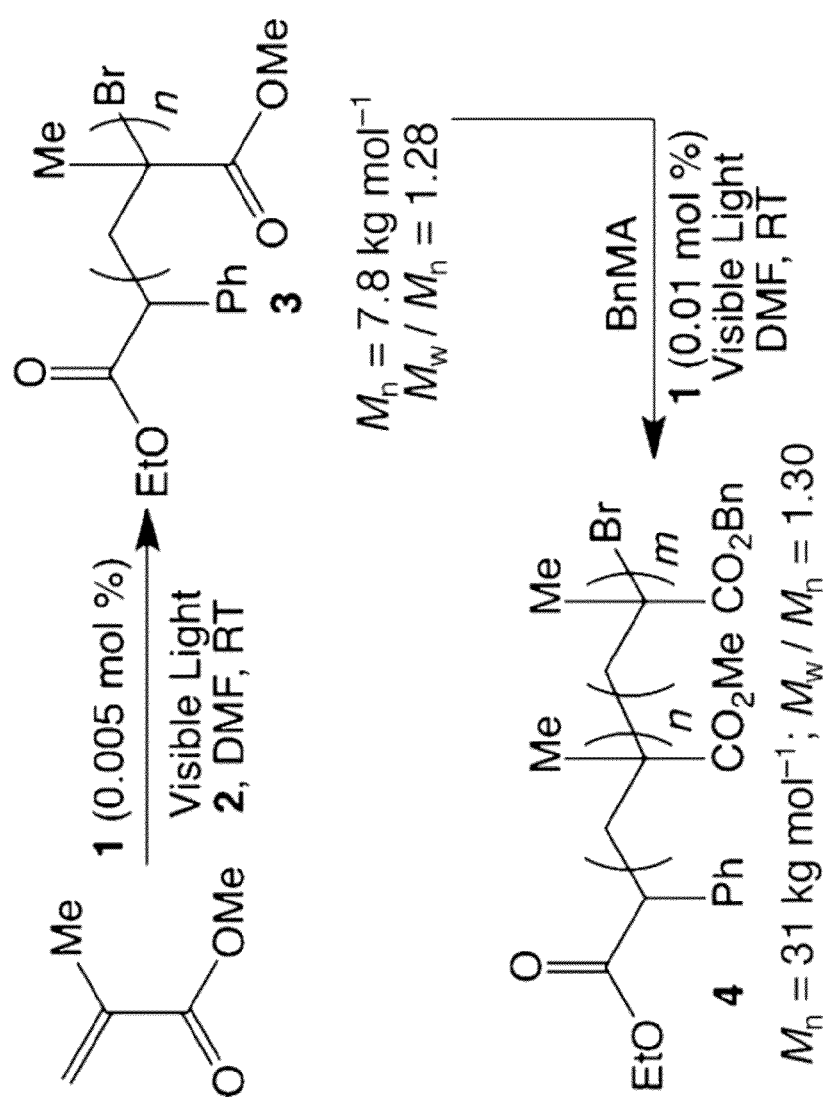

To further probe the nature of this system, as well as demonstrate the presence of active bromo groups at the chain ends, block copolymers were prepared using sequential photocontrolled radical procedures (FIG. 10). Initially, irradiation of a mixture of methyl methacrylate and the initiator 2 in the presence of the iridium photocatalyst 1 (0.005 mol %) afforded a well-defined PMMA derivative, 3, with controlled molecular weight and low polydispersity. Use of 3 as a macroinitiator in the polymerization of benzyl methacrylate and in this case, 0.01 mol % of 1, proved to be a well-behaved process leading to the desired poly(methyl methacrylate)-b-(benzyl methacrylate) diblock copolymer 4, with size exclusion chromatography showing little or no starting macroinitiator (FIG. 10). This efficient block copolymer formation further illustrates that minimal termination is occurring during the polymerization process.

A major difference between the reported photocontrolled radical polymerization and traditional ATRP procedures is the stability of the catalyst, with the Ir-based system being extremely tolerant to a variety of functional groups. To demonstrate this added versatility, the synthesis of homopolymers of methacrylic acid (MAA), which is notoriously difficult to polymerize under ATRP conditions, and random copolymers of MAA and benzyl methacrylate (BnMA) were examined. Under standard conditions and at 10% incorporation of MAA, excellent control over molecular weight and a low polydispersity were observed. Moreover, the polydispersity increased only slightly with higher MAA content (FIG. 13). These polymerizations in the presence of a free carboxylic acid exemplify the robust nature of the Ir-based catalyst 1. Moreover, this excellent functional-group tolerance is an additional advantage over a traditional Cu-based ATRP process.

Additionally, when 1 was combined with various concentrations of MMA, no change in the fluorescence of the Ir-complex was detected. However, when the same experiment was performed with the initiator, ethyl α-bromophenylacetate, a concentration dependent fluorescence quenching was observed. These results demonstrate that the excited Ir(III)* complex is undergoing a redox process with the initiator and not reacting with the monomer.

Illustrative Reagent Information

All reactions were carried out under an argon atmosphere. The dimethyl formamide (DMF) was purchased from Fischer Scientific and vigorously purged with argon. The solvent was further purified by passing it under argon pressure through a Pure Solv 400-3-MD solvent purification system. Methyl methacrylate (MMA), benzyl methacrylate (BnMA) and methacrylic acid (MAA) were purchased from Sigma-Aldrich and passed through a plug of basic alumina and filter agent before use. Complex 1 [fac-Ir(ppy)$_3$] and ethyl α-bromophenylacetate were purchased from Sigma-Aldrich and used as received. 50-Watt fluorescent lamps were used as the light source.

Illustrative Analytical Information

Nuclear magnetic resonance spectra were recorded on a Varian 400 MHz, a Varian 500 MHz or a Varian 600 MHz instrument. All $^1$H NMR experiments are reported in δ units, parts per million (ppm), and were measured relative to the signals for residual chloroform (7.26 ppm) in the deuterated solvent, unless otherwise stated. All $^{13}$C NMR spectra are reported in ppm relative to deuterochloroform (77.23 ppm), unless otherwise stated, and all were obtained with $^1$H decoupling. Gel permeation chromatography (GPC) was performed on a Waters 2695 separation module with a Waters 2414 refractive index detector in chloroform with 0.25% triethylamine. Number average molecular weights ($M_n$) and weight average molecular weights ($M_w$) were calculated relative to linear polystyrene standards.

Illustrative Light Source

All reactions were placed within 3 cm of two 50 W fluorescent lamps, which were on either side of the reaction. In order to obtain a value for the intensity of light that is absorbed by the catalyst in these reactions a monochromatic light source (blue LED's; λ=435 nm) was used. At a distance of 1 inch from the LED's the polymerizations showed a similar kinetic profile to the same reaction using the fluorescent lamps. The intensity of the light 1-inch from the blue LED's was found to be 0.5 mW/cm$^2$. For these studies the blue LED's were purchased from Creative Lighting Solutions.

General Procedure Followed to Obtain Data Presented in FIG. 12

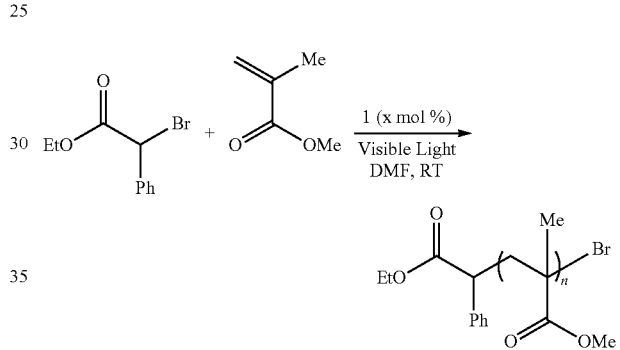

Figure 14:
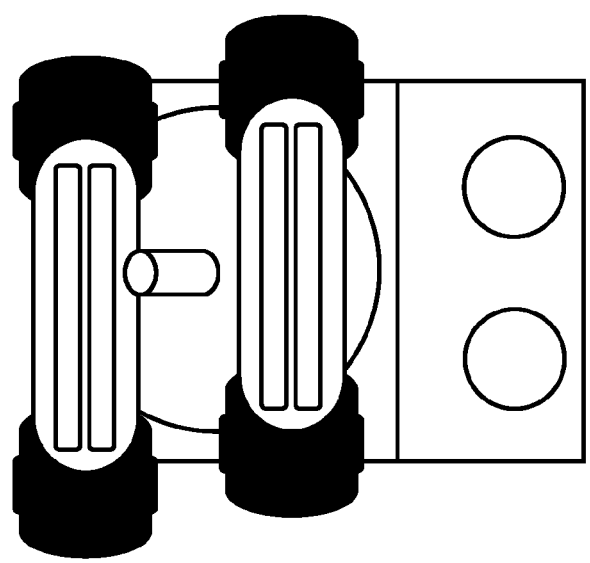
FIG. 14: photographic image of illustrative equipment used in polymerization reactions.
Figure 14:
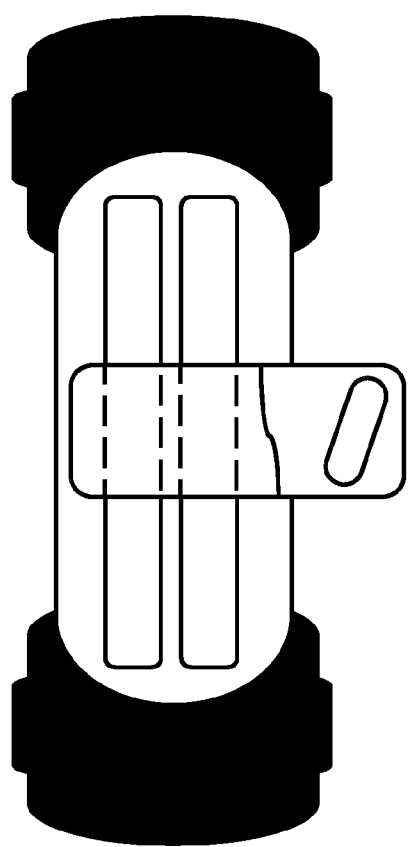

A vial, which was equipped with a magnetic stir bar and fitted with a teflon screw cap septum, was charged with MMA (401 µL, 3.75 mmol), complex 1 (0-0.2 mol %) and DMF (1.4 mL). The reaction mixture was degassed by freeze-pump-thaw cycles (this process was repeated a total of 3 times). The vial was then backfilled with argon and ethyl α-bromophenylacetate (0.002-0.2 equiv) was injected via syringe. The reaction was stirred in front of a 50 W fluorescent lamp (see FIG. 14) until it reached ca. 50% conversion of the MMA as monitored by $^1$H NMR. An aliquot was then removed from the reaction mixture and analyzed by GPC to give the number average molecular weight ($M_n$), weight average molecular weight ($M_w$) and molecular weight distribution ($M_w/M_n$) of the polymer.

Illustrative Fluorescence Quenching Studies

Figure 15:
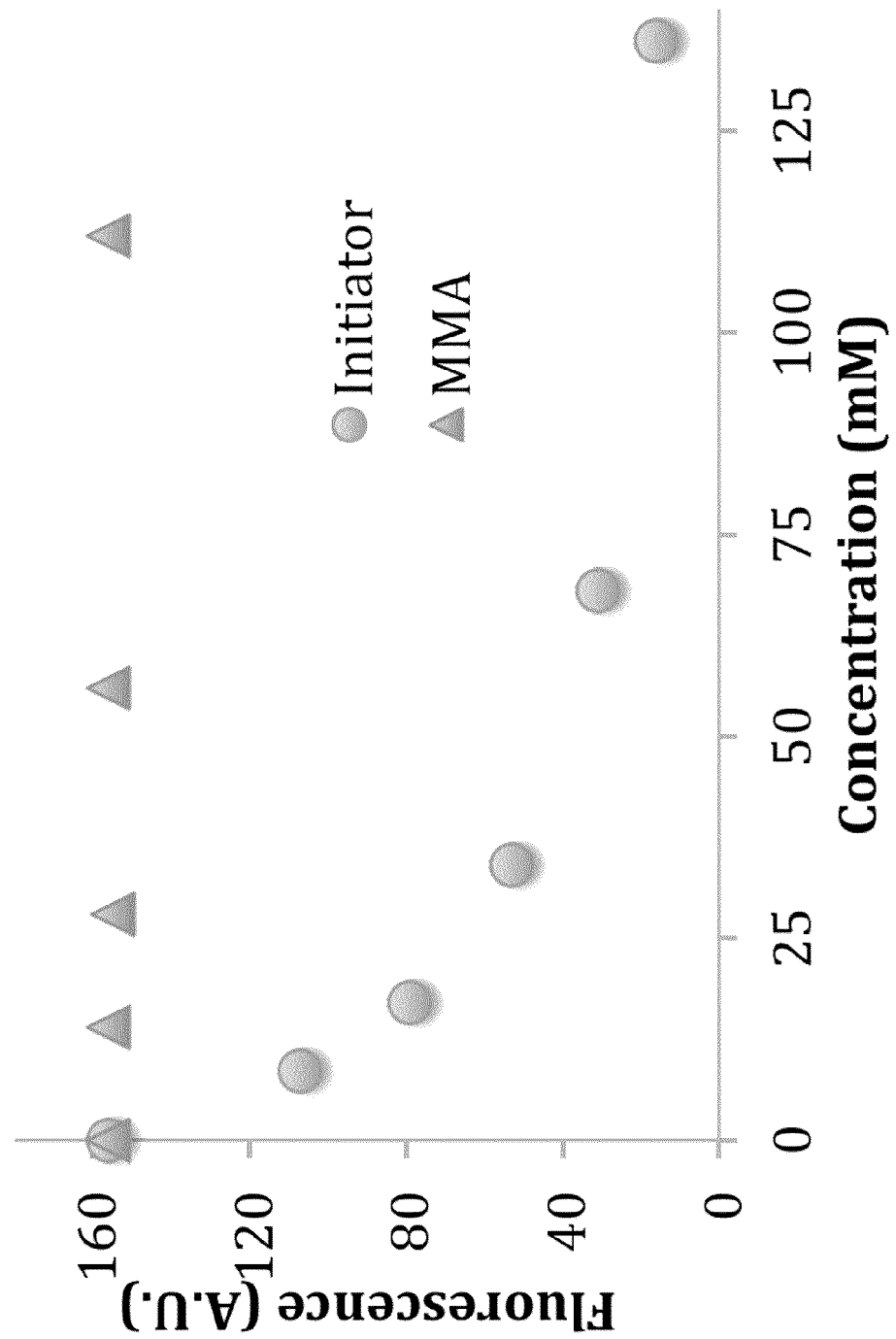
FIG. 15: graphed data showing fluorescence of a 0.13 mM solution of 1 in DMF with varying concentrations of methyl methacrylate (MMA) or ethyl α-bromophenylacetate (initiator).
Figure 16:
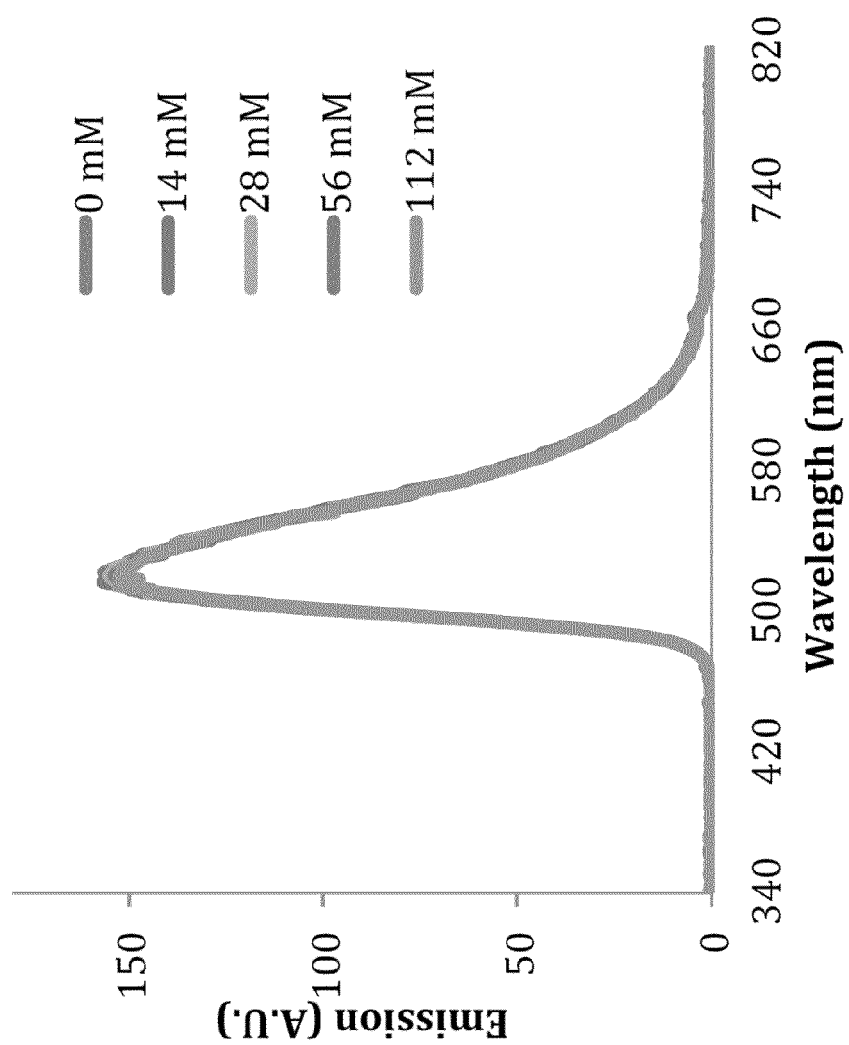
FIG. 16: graphed data showing fluorescence of a 0.13 mM solution of 1 in DMF with varying concentrations of methyl methacrylate (MMA).
Figure 17:
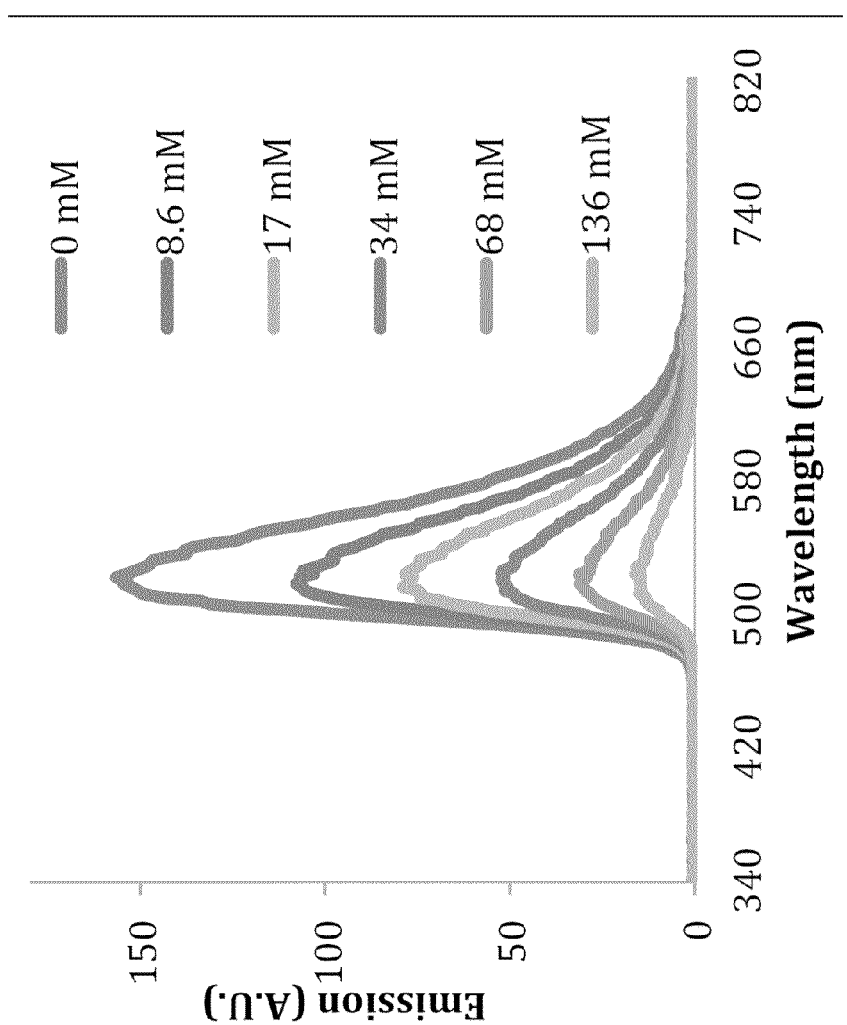
FIG. 17: graphed data showing fluorescence of a 0.13 mM solution of 1 in DMF with varying concentrations of ethyl α-bromophenylacetate (initiator).

A Varian Cary Eclipse Fluorescence Spectrophotometer was used for the quenching studies. The Ir(ppy)$_3$ (complex 1) solutions were excited at 334 nm. The emission of a 0.13 mM solution of complex 1 in DMF was first measured at varying concentrations of MMA (0-112 mM). As shown in FIGS. 15 and 16 no quenching of the emission of complex 1 was observed at any of the concentrations of MMA. The emission of a 0.13 mM solution of complex 1 in DMF was also measured at varying concentrations of ethyl α-bromophenylacetate (0-136 mM). As shown in FIGS. 15 and 17 a concentration dependent fluorescence quenching was observed.

Reaction Monitoring for Optimized Conditions Presented in FIG. 12

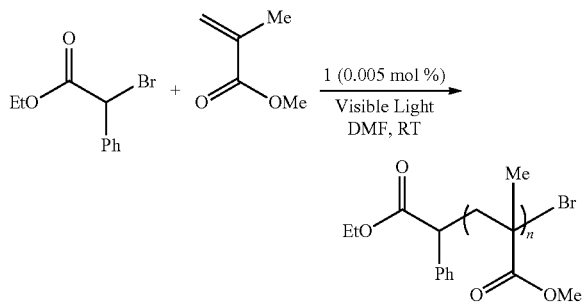

Figure 18:
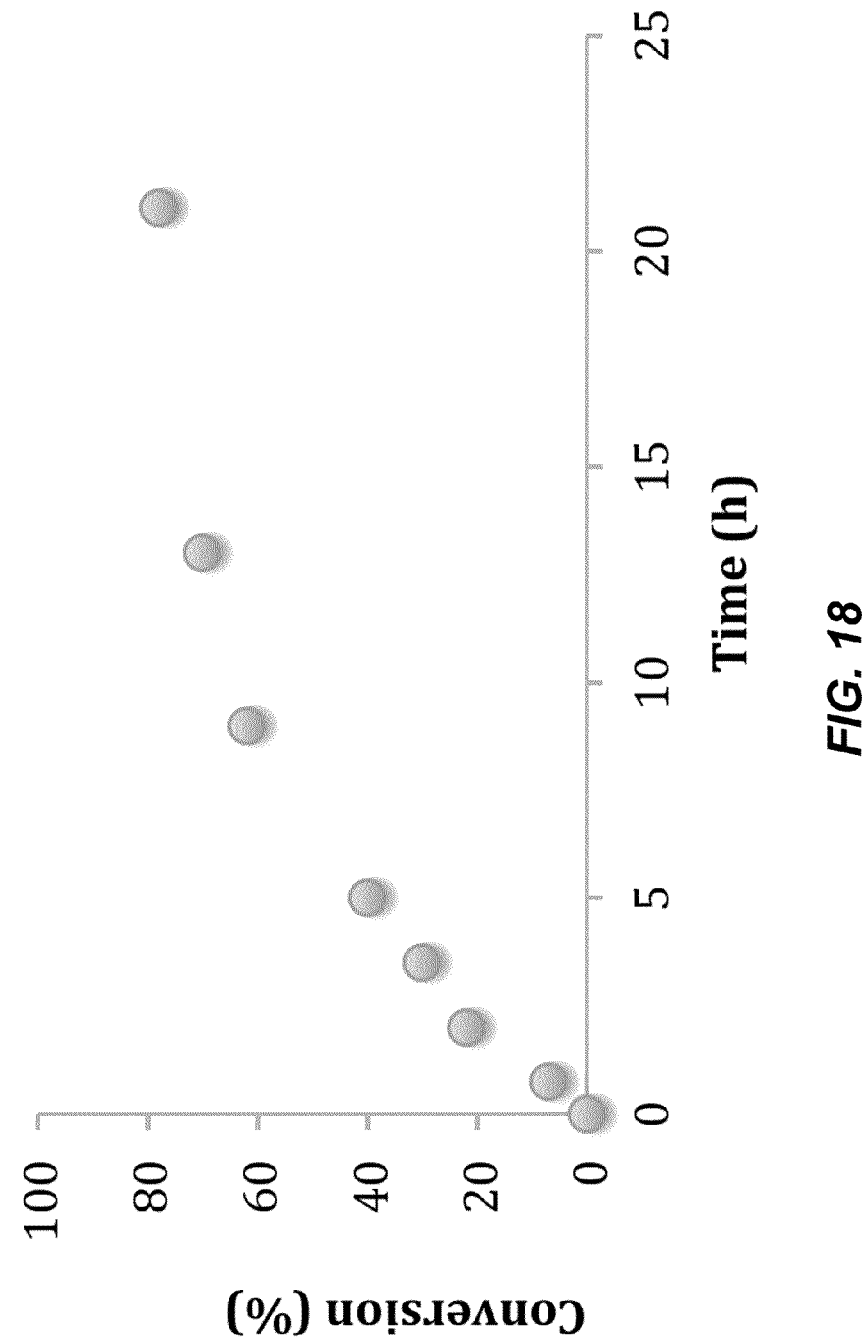
FIG. 18: graphed data showing conversion vs time for the polymerization of methyl methacrylate.
Figure 19:
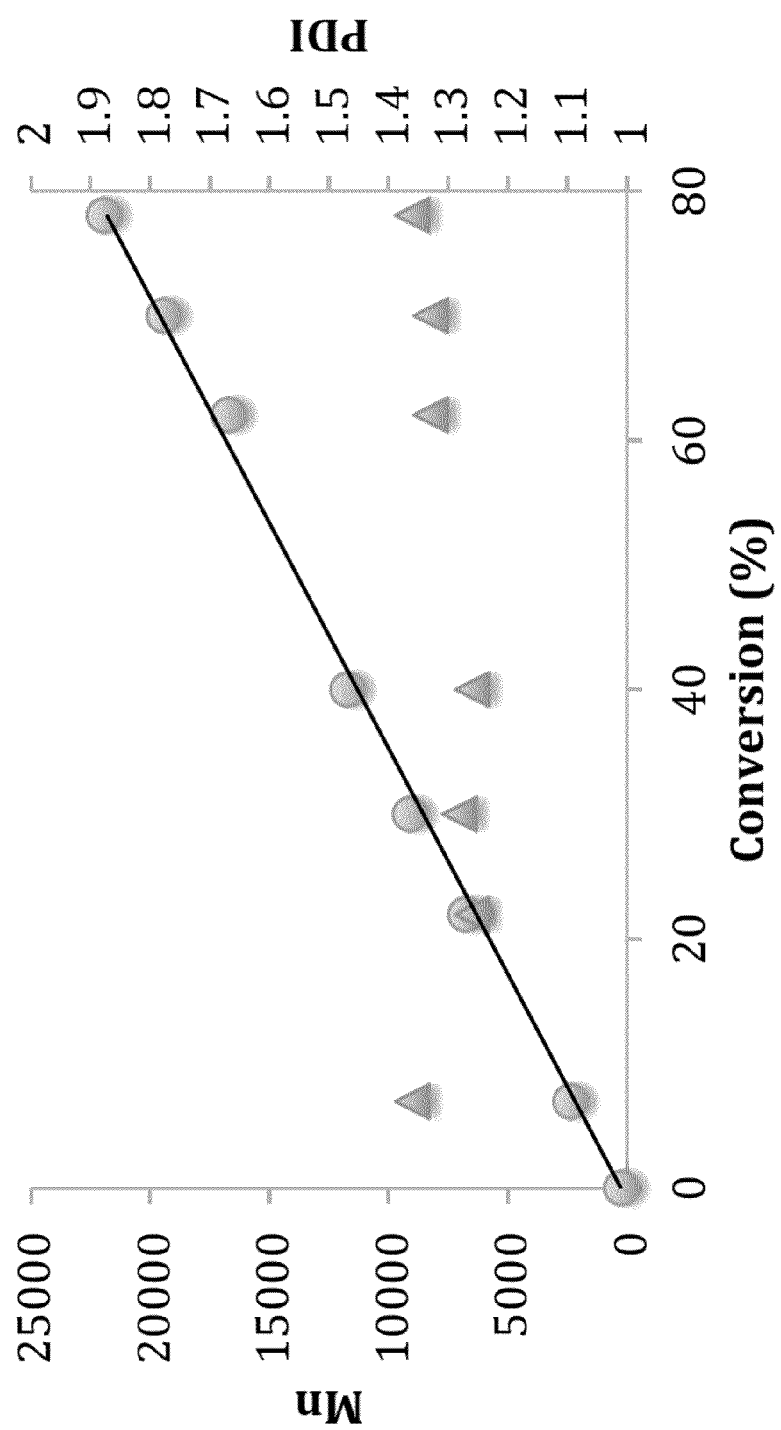
FIG. 19: graphed data showing conversion vs number average molecular weight (circle) and conversion vs the molecular weight distribution (triangle) for the polymerization of methyl methacrylate.

A vial, which was equipped with a magnetic stir bar and fitted with a teflon screw cap septum, was charged with MMA (401 µL, 3.75 mmol), complex 1 (0.123 mg, 0.005 mol %) and DMF (1.4 mL). The reaction mixture was degassed by freeze-pump-thaw cycles (this process was repeated a total of 3 times). The vial was then backfilled with argon and ethyl α-bromophenylacetate (2.62 µL, 0.015 mmol) was injected via syringe. The reaction was stirred in front of a 50 W fluorescent lamp, and aliquots were removed from the reaction mixture via syringe under a positive pressure of argon at different time points. The samples were analyzed by $^1$H NMR to give the conversion of MMA and GPC to give the number average molecular weight ($M_n$), weight average molecular weight ($M_w$) and molecular weight distribution ($M_w/M_n$) of the polymer. For data see FIG. 18 and FIG. 19.

General Procedure Followed to Obtain Data Presented in FIG. 10

A vial, which was equipped with a magnetic stir bar and fitted with a septum, was charged with MMA (1.20 mL, 11.25 mmol), complex 1 (0.37 mg, 0.005 mol %) and DMF (4.2 mL). The reaction mixture was degassed by freeze-pump-thaw cycles (this process was repeated a total of 3 times). The vial was then backfilled with argon, covered in aluminum foil and ethyl α-bromophenylacetate (2.62 µL, 0.015 mmol) was injected via syringe. The reaction was stirred in the absence of light. After 1 hour an aliquot was removed from the reaction mixture via syringe under a positive pressure of argon. The vial was then placed in front of a 50 W fluorescent lamp and allowed to stir. After 2 hours an additional aliquot was removed from the reaction mixture and the vial was immediately covered with aluminum foil and stirred in the absence of light. This process was then repeated several times (see FIG. 9). The samples were analyzed by $^1$H NMR to give the conversion of MMA and GPC to give the number average molecular weight ($M_n$), weight average molecular weight ($M_w$) and molecular weight distribution ($M_w/M_n$) of the polymer.

General Procedure Followed to Obtain Data Presented in FIG. 12

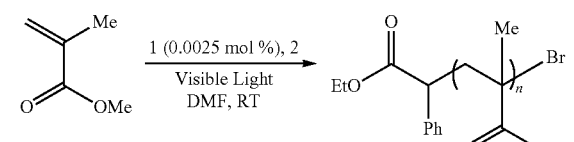

Poly(methyl methacrylate) A vial, which was equipped with a magnetic stir bar and fitted with a septum, was charged with MMA (2.4 mL, 22.5 mmol), complex 1 (1.4 mg, 0.005 mol %) and DMF (8.4 mL). The reaction mixture was degassed by freeze-pump-thaw cycles (this process was repeated a total of 3 times). The vial was then backfilled with argon and ethyl α-bromophenylacetate (15.7 µL, 0.09 mmol) was injected via syringe. The reaction was stirred in front of a 50 W fluorescent lamp for 4 hours and then covered with aluminum foil for 5 minutes. While still covered with the aluminum foil the reaction mixture was transferred via cannula to an erlenmeyer flask containing a cold mixture of methanol and water (10:1, 300 mL) that was being vigorously stirred. A white precipitate formed, which was filtered, taken up in a minimal amount of $CH_2Cl_2$ and precipitated a second time from a cold mixture of methanol and water (10:1, 300 mL). The white precipitate was then filtered and dried to give 423 mg of the desired product. $M_n$=7800 g/mol, $M_w/M_n$=1.28; $^1$H NMR (500 MHz, CDCl$_3$) δ: 3.57 (s, 3H), 1.96-1.72 (m, 1.7H), 1.40 (m, 0.16H), 1.16 (m, 0.12H), 1.00 (s, 1H), 0.82 (bs, 2H) ppm. $^{13}$C NMR (500 MHz, CDCl$_3$) δ: 178.1, 177.8, 177.0, 54.4, 54.2, 51.8, 44.9, 44.5, 18.7, 16.4 ppm. IR (neat, cm$^{-1}$): 2990, 2950, 1727, 1435, 1270, 1240, 1191, 988, 841, 749.

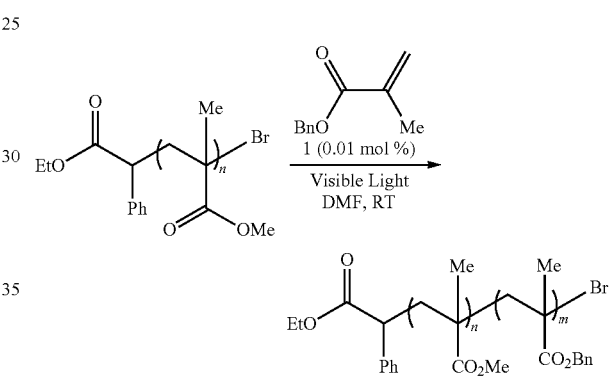

Poly(methyl methacrylate)-b-(benzyl methacrylate) A vial, which was equipped with a magnetic stir bar and fitted with a septum, was charged with benzyl methacrylate (635 µL, 3.75 mmol), the macroinitiator (111 mg, 0.015 mmol) and DMF (1.4 mL). The reaction mixture was degassed by freeze-pump-thaw cycles (this process was repeated a total of 3 times). The vial was then backfilled with argon and a solution of complex 1 in DMF (200 µL, 0.01 mol %), which had been degassed in an analogous fashion as described for the reaction mixture above, was injected via syringe. The reaction was stirred in front of a 50 W fluorescent lamp for 5 hours and then covered with aluminum foil for 5 minutes. The reaction mixture was then added in a dropwise ashion to an erlenmeyer flask containing a mixture of cold methanol and water (10:1, 200 mL) that was being vigorously stirred. A white precipitate formed, which was filtered, taken up in a minimal amount of $CH_2Cl_2$ and precipitated a second time from a cold mixture of methanol and water (10:1, 200 mL). The white precipitate was then filtered and dried to give 392 mg of the desired product. $M_n$=30,600 g/mol, $M_w/M_n$=1.30; $^1$H NMR (500 MHz, CDCl$_3$) δ: 7.26 (s, 10.5H), 4.89 (bs, 4.26H), 3.61 (s, 3H), 2.00-1.63 (m, 5.26H) 1.03 (s, 0.76H), 0.89 (m, 3.7H), 0.71 (s, 4.28H) ppm. $^{13}$C NMR (500 MHz, CDCl$_3$) δ: 177.0, 135.4, 135.2, 128.5, 128.4, 128.2, 66.7, 54.4, 51.7, 45.1, 44.8, 44.6, 18.8, 16.6 ppm. IR (neat, cm$^{-1}$): 2949, 1725, 1454, 1387, 1239, 1141, 966, 912, 749, 696.

General Procedure Followed to Obtain Data Presented in FIG. 13

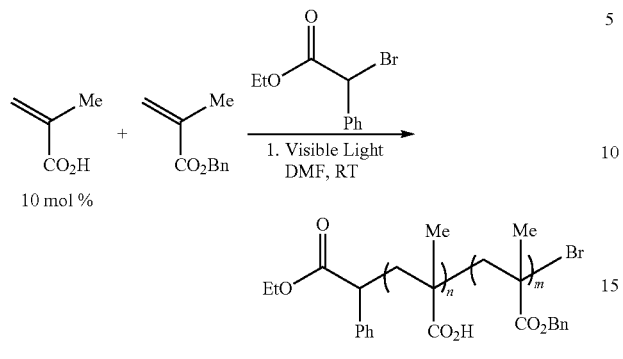

Poly(benzyl methacrylate-ran-methacrylic acid) (FIG. 13, entry 1) A vial, which was equipped with a magnetic stir bar and fitted with a septum, was charged with benzyl methacrylate (1.14 mL, 6.75 mmol), methacrylic acid (63 µL, 0.75 mmol, 10 mol %), complex 1 (0.25 mg, 0.005 mol %) and DMF (2.8 mL). The reaction mixture was degassed by freeze-pump-thaw cycles (this process was repeated a total of 3 times). The vial was then backfilled with argon and ethyl α-bromophenylacetate (5.24 µL, 0.030 mmol) was injected via syringe. The reaction was stirred in front of a 50 W fluorescent lamp for 5 hours ($^1$H NMR of the crude reaction mixture showed ca. 50% conversion of the benzyl methacrylate). The reaction mixture was then added dropwise to cold diethyl ether (250 mL) that was being vigorously stirred. An off-white precipitate formed, which was filtered, taken up in a minimal amount of $CH_2Cl_2$ and was precipitated a second time from cold diethyl ether (250 mL). The off-white precipitate was then filtered and dried to give 475 mg of the desired product. $^1$H NMR (500 MHz, $CDCl_3$) δ: 7.27 (s, 5H), 4.87 (bs, 2H), 2.05-1.65 (m, 1.87H), 1.43-1.05 (m, 0.37H), 0.91 (s, 1.34H), 0.73 (s, 1.8H) ppm. $^{13}$C NMR (500 MHz, $CDCl_3$) δ: 177.1, 176.4, 135.4, 135.1, 129.0, 128.5, 128.4, 128.2, 125.3, 66.8, 54.1, 45.1, 44.8, 18.5, 16.6 ppm. IR (neat, $cm^{-1}$): 2949, 1722, 1454, 1387, 1236, 1138, 963, 911, 747.

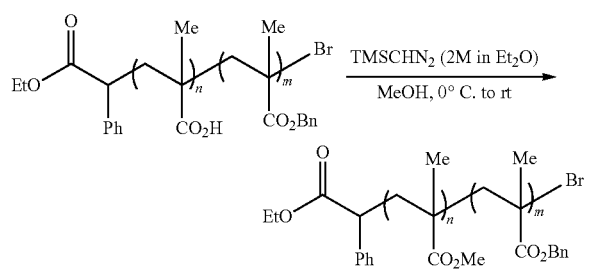

In order to further characterize the random copolymer of benzyl methacrylate and methacrylic acid by GPC it was methylated to afford poly(benzyl methacrylateran-methyl methacrylate) (see, e.g. E. Kühnel et al. Angew. Chem. Int. Ed. 2007, 46, 7075-7078). A vial, which was equipped with a magnetic stir bar and fitted with a septum, was charged with the poly(benzyl methacrylate-ranmethacrylic acid) (20 mg). The reaction vessel was purged with argon and then methanol was added via syringe (1.5 mL). The reaction mixture was cooled to 0° C. and then solution of $TMSCHN_2$ (300 µL, 2M in diethyl ether) was added dropwise over a 5 minute period. The reaction was warmed to room temperature and allowed to stir for 4 hours. Acetic acid (100 µL) was then added slowly to the reaction mixture to quench the excess $TMSCHN_2$ ($^1$H NMR of the crude reaction mixture showed ca. 9 mol % incorporation of the methacrylic acid). The solvent and byproducts of the reaction were then removed under vacuum for a 16-hour period to give the desired product, which was analyzed by GPC. $M_n$=21,000 g/mol, $M_w/M_n$=1.24.

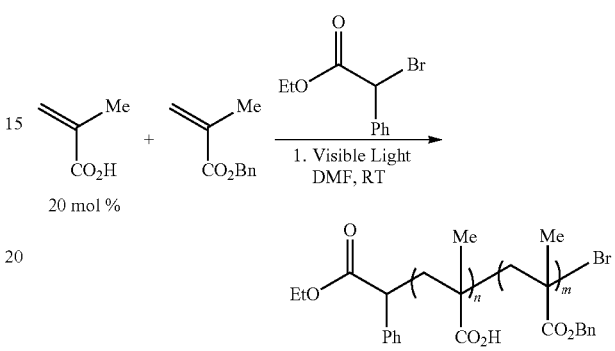

Poly(benzyl methacrylate-ran-methacrylic acid) (FIG. 13, entry 2) A vial, which was equipped with a magnetic stir bar and fitted with a septum, was charged with benzyl methacrylate (1.14 mL, 6.75 mmol), methacrylic acid (128 µL, 0.75 mmol, 20 mol %), complex 1 (0.25 mg, 0.005 mol %) and DMF (2.8 mL). The reaction mixture was degassed by freeze-pump-thaw cycles (this process was repeated a total of 3 times). The vial was then backfilled with argon and ethyl α-bromophenylacetate (5.24 µL, 0.030 mmol) was injected via syringe. The reaction was stirred in front of a 50 W fluorescent lamp for 5 hours ($^1$H NMR of the crude reaction mixtures showed ca. 50% conversion of the benzyl methacrylate). The reaction mixture was then added dropwise to cold diethyl ether (250 mL) that was being vigorously stirred. An off-white precipitate formed, which was filtered, taken up in a minimal amount of $CH_2Cl_2$ and was precipitated a second time from cold diethyl ether (250 mL). The off-white precipitate was then filtered and dried to give 457 mg of the desired product. $^1$H NMR (500 MHz, $CDCl_3$) δ: 7.27 (s, 5H), 4.80 (bs, 2H), 2.05-1.40 (m, 1.64H), 1.38-1.05 (m, 0.35H), 0.95-0.20 (m, 3.47H) ppm. $^{13}$C NMR (500 MHz, $CDCl_3$) δ: 177.0, 135.4, 135.1, 128.5, 128.2, 66.8, 54.0, 45.1, 44.8, 16.3 ppm. IR (neat, $cm^{-1}$): 3030, 2946, 1722, 1454, 1386, 1237, 1138, 964, 746, 692.

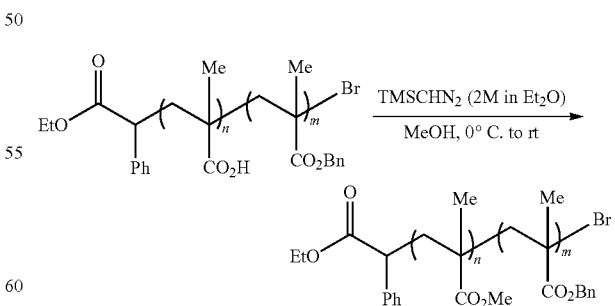

In order to further characterize the random copolymer of benzyl methacrylate and methacrylic acid by GPC it was methylated to afford poly (benzyl methacrylateran-methyl methacrylate) (see, e.g. E. Kühnel et al. *Angew. Chem. Int. Ed.* 2007, 46, 7075-7078). A vial, which was equipped with a magnetic stir bar and fitted with a septum, was charged with the poly (benzyl methacrylate-ranmethacrylic acid) (20 mg). The reaction vessel was purged with argon and then methanol was added via syringe (1.5 mL). The reaction mixture was cooled to 0° C. and then solution of TMSCHN$_2$ (300 μL, 2M in diethyl ether) was added dropwise over a 5 minute period. The reaction was warmed to room temperature and allowed to stir for 4 hours. Acetic acid (100 μL) was then added slowly to the reaction mixture to quench the excess TMSCHN$_2$ ($^1$H NMR of the crude reaction mixture showed ca. 16 mol % incorporation of the methacrylic acid). The solvent and byproducts of the reaction were then removed under vacuum for a 16-hour period to give the desired product, which was analyzed by GPC. $M_n$=22,000 g/mol, $M_w/M_n$=1.36.

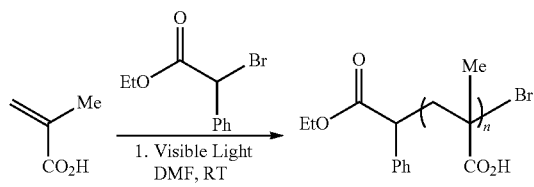

Poly(methacrylic acid) (FIG. 13, entry 3) A vial, which was equipped with a magnetic stir bar and fitted with a septum, was charged with methacrylic acid (317 μL, 3.75 mmol), complex 1 (3.1 mg) and DMF (1.0 mL). The reaction mixture was degassed by freeze-pump-thaw cycles (this process was repeated a total of 3 times). The vial was then backfilled with argon and ethyl α-bromophenylacetate (2.62 μL, 0.015 mmol) was injected via syringe. The reaction was stirred in front of a 50 W fluorescent lamp for 72 hours. The reaction mixture was then added dropwise to cold diethyl ether (100 mL) that was being vigorously stirred. An off-white precipitate formed, which was filtered, taken up in a minimal amount of CH$_2$Cl$_2$ and was precipitated a second time from cold diethyl ether (100 mL). The white precipitate was then filtered and dried to give 110 mg of the desired product. $^1$H NMR (600 MHz, CD$_3$OD) δ: 2.14-1.78 (m, 1.86H), 1.54 (bs, 0.13H), 1.22-1.05 (m, 3H) ppm. $^{13}$C NMR (600 MHz, CD$_3$OD) δ: 180.8, 179.9, 54.1, 48.4, 44.9, 44.5, 17.8, 15.9 ppm. IR (neat, cm$^{-1}$): 3165, 2990, 1698, 1481, 1448, 1389, 1259, 1168, 961, 929, 796.

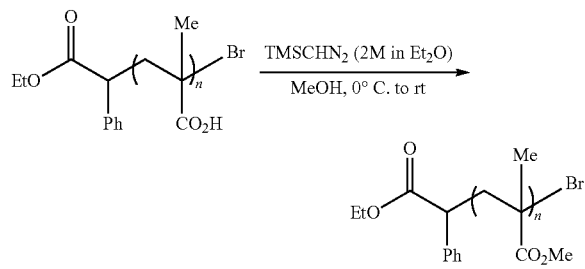

In order to further characterize the polymethacrylic acid by GPC it was methylated to afford poly(methyl methacrylate). A vial, which was equipped with a magnetic stir bar and fitted with a septum, was charged with the poly(methacrylic acid) (10 mg). The reaction vessel was purged with argon and then methanol was added via syringe (2 mL). The reaction mixture was cooled to 0° C. and then solution of TMSCHN$_2$ (400 μL, 2M in diethyl ether) was added dropwise over a 5 minute period. The reaction was warmed to room temperature and allowed to stir for 4 hours. Acetic acid (100 μL) was then added slowly to the reaction mixture to quench the excess TMSCHN$_2$. The solvent and byproducts of the reaction were then removed under vacuum for a 16-hour period to give the desired product, which was analyzed by GPC. $M_n$=28,500 g/mol, $M_w/M_n$=1.61.

The following examples are given to aid in understanding the invention, but it is to be understood that the invention is not limited to the particular materials or procedures of examples.

EXAMPLES

The following Example(s) illustrate the versatility and scope of the embodiments of the instant invention.

Example 1

Surface Patterning with Light: Spatial and Temporal Control of Brush Formation on Surfaces Utilizing Light-Mediated Controlled Radical Polymerizations Radical polymerizations have become a powerful and widely utilized synthetic tool for the formation of well-defined polymers that are diverse in their structure and function. The capability to regulate these processes by an external stimulus would greatly increase their applicability across a number of fields and allow for the synthesis of previously inaccessible macromolecular structures. On this basis, a radical polymerization that can be efficiently and reversibly activated or deactivated by light has been developed. This new polymerization process is highly responsive to the external stimulus (light) and allows for both temporal and spatial control over the chain growth process.

One of the most powerful applications of this new photocontrolled polymerization is its utilization in surface patterning. By taking advantage of both the temporal and spatial control that this system provides, brush growth from surfaces could be efficiently regulated by light. This would permit well-defined patterning with light, as well as enable precise control over the film thickness (polymer chain length).

This type of procedure offers major advantages over current methods for patterning using surface initiated polymerizations. Typically this type of spatial control over brush growth has been achieved by first patterning the initiator on the surface followed by polymerization. This type of patterning has been achieved through various lithographic techniques In these methods brush formation on the surface occurred where initiator was bound and initiator graft density controlled film thickness.

Figure 2A:
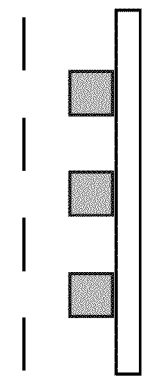
FIG. 2: (A) diagram showing use of a photomask to pattern surfaces with a light-mediated controlled radical polymerization. (B) diagram showing use of a neutral density filter to pattern surfaces via a light-mediated controlled radical polymerization reaction.
Figure 2A:
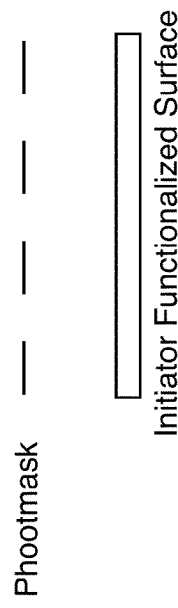
Figure 2B:
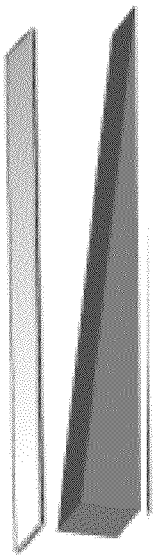
Figure 2B:
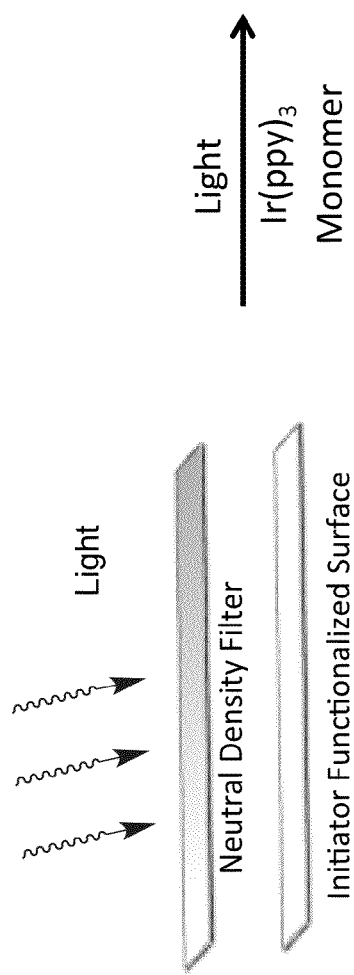

Using the new technique presented herein, the issue of pre-patterning the initiator can be circumvented. Utilizing a surface that is uniformly functionalized with initiator, brush formation can be achieved wherever the surface is irradiated with light, allowing for spatial control over chain extension. Further, artisans can efficiently control film thickness by regulating the length of chains that are grown. This can be achieved in two ways: 1) by controlling the amount of time a chain is irradiated with a certain intensity of light or 2) by effectively modulating the intensity of light that a chain end is exposed to. For example, by using a traditional photomask, chain growth will occur where light reaches the surface and the film thickness can be controlled by the amount of time the surface is irradiated (FIG. 2a). Alternatively, by using a filter that can modulate the intensity of light, the polymer chain lengths will be directly proportional to the intensity of light that reaches the surface (FIG. 2b). Use of grayscale photomasks with this strategy will allow for highly detailed patterns on surfaces. It is worth noting that after initial patterning the entire surface will still contain initiators, allowing for further patterning, as well as block copolymer formation. This would not be possible using previous methods where the initiator was patterned on the surface.

Figure 6:
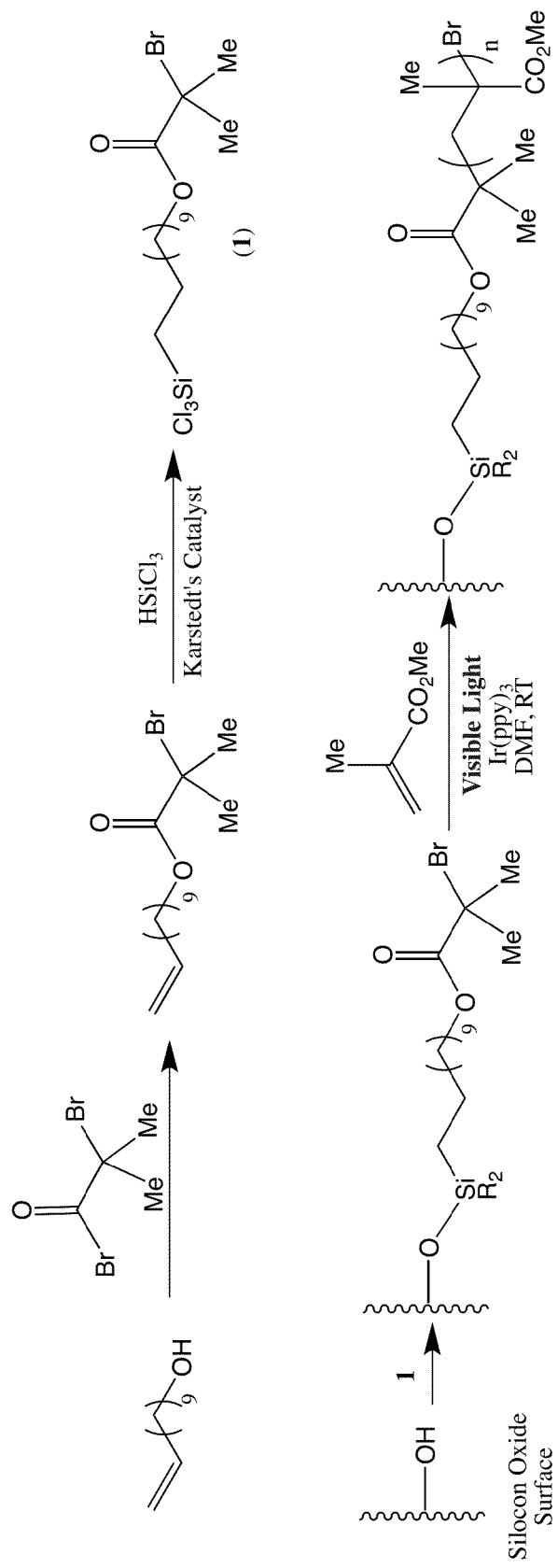
FIG. 6: schematic diagram showing functionalization and patterning of silicon oxide surfaces.

With this goal in mind, alkyl bromide functionalized silicon oxide surfaces were formed (FIG. 6). For initial studies, a TEM grid was used as a photomask and poly(methyl methacrylate) (MMA) brushes were grown from the surface. A solution of MMA and Ir(ppy)$_3$ in dimethyl formamide (DMF) was layered on the functionalized surface followed by placement of the TEM grid. The surface was then irradiated for 1 hour with a blue LED ($\lambda$=435 nm). The light source was then removed and the surface was washed with DMF and methylene chloride to remove the catalyst, remaining monomer and TEM grid. The patterned surface was visualized under an optical microscope (FIGS. 3a, 3b and 3c).

Figure 3A:
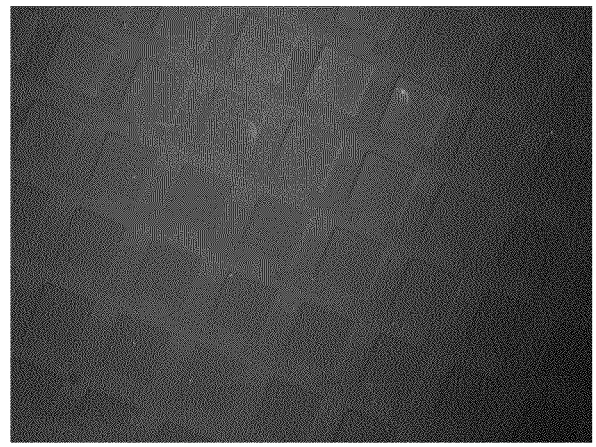
FIG. 3: (A) photographic image of a poly(methyl methacrylate) brush patterned surface. (B) photographic image of a poly(methyl methacrylate) brush patterned surface. (C) photographic image of a poly(methyl methacrylate) brush patterned surface.
Figure 3B:
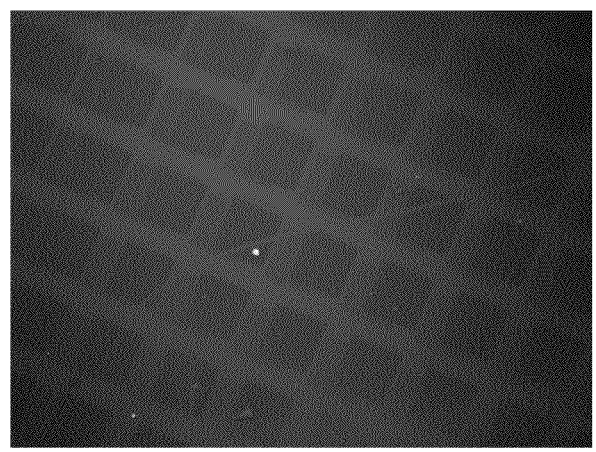
Figure 3C:
Figures 4A, 4B:
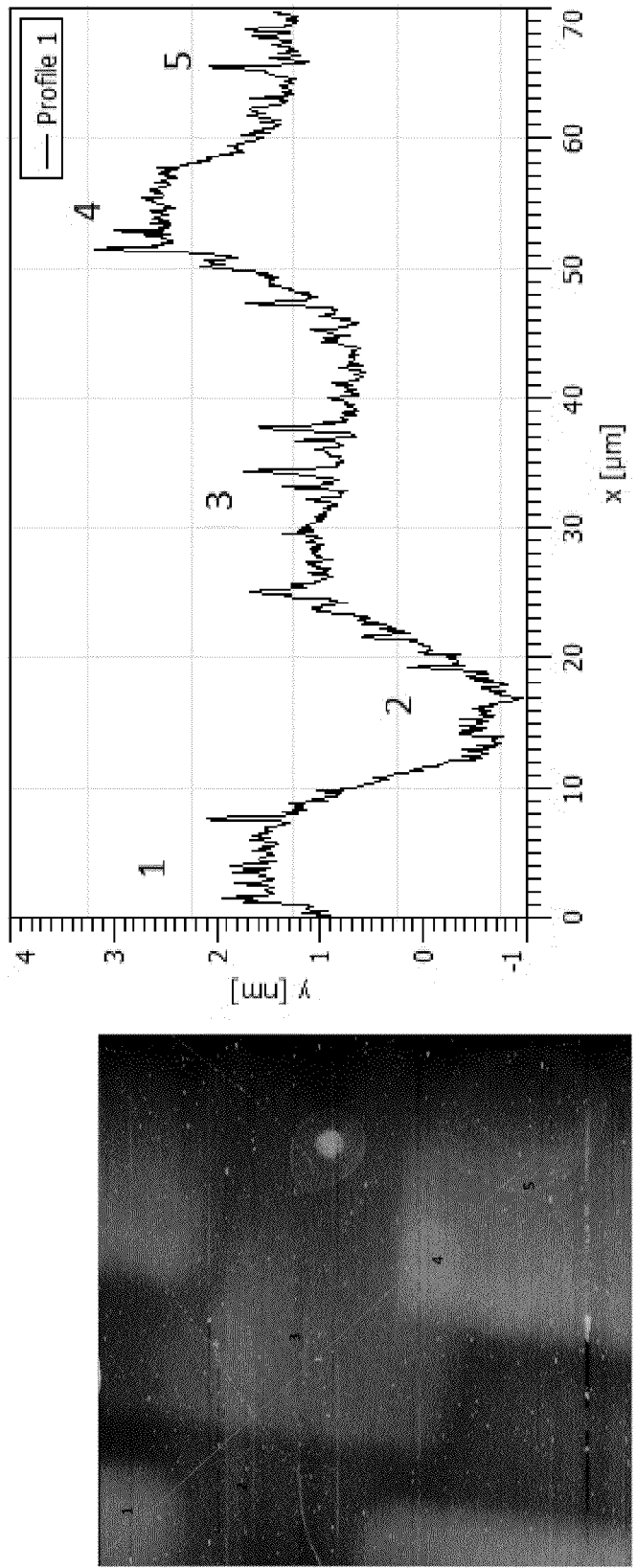
FIG. 4: (A) photographic AFM image of a poly(methyl methacrylate) brush patterned surface. (B) graphed data showing an AFM height profile of a poly(methyl methacrylate) brush patterned surface.

FIGS. 3a, 3b and 3c show a clear patterning of brush growth in the areas that were irradiated with light. Moreover, the TEM grid moved slightly during polymerization affording two separate patterns with different film thicknesses. This clearly shows that extended chain lengths are achieved with longer irradiation times and nicely demonstrates both spatial and temporal control of brush growth on the surface by light irradiation. Further, the atomic force microscope image in FIG. 4 precisely shows the height difference for areas that were irradiated by light for different amounts of time.

Figure 5:
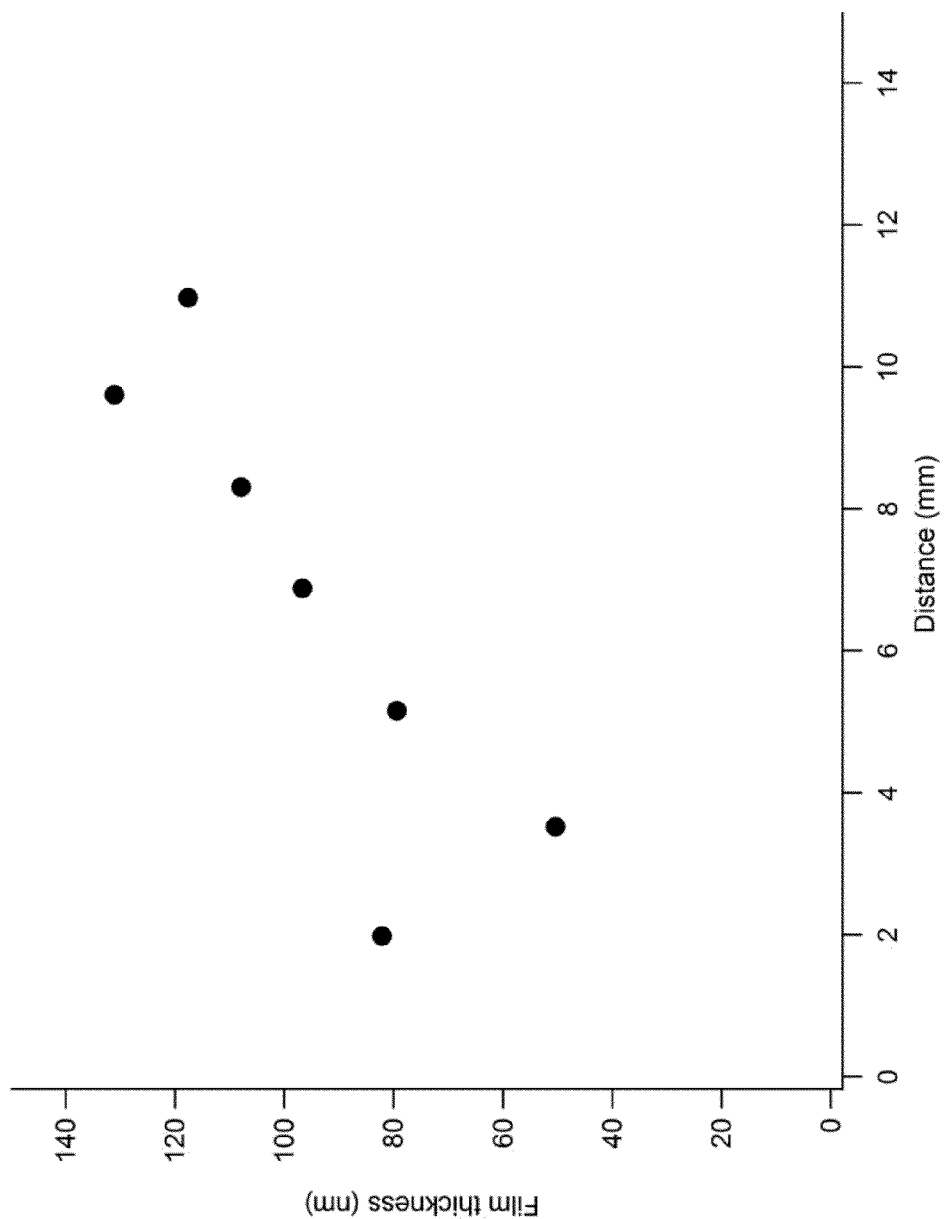
FIG. 5: graph showing a plot of film thickness as a function of distance along a gradient.

The ability to control polymer brush height by modulating the intensity of light was investigated by irradiating the substrate through a linear variable neutral density filter (FIG. 2b). A clear gradient is visible to the naked eye on the region of the substrate where the neutral density filter was placed. Profilometry measurements taken along the gradient reveal a linear increase in film thickness as a function of distance, as show in FIG. 5. This technique can be extended to more complex structures such as sinusoidal patterns, microlenses, prisms, etc. by using an appropriate photomask.

In summary, a new, highly efficient method for surface patterning is disclosed. Using a light-mediated controlled radical polymerization procedure, brush formation from a surface can be regulated spatially by controlling the area of irradiation. Moreover, the chain length (or film thickness) can be effectively controlled by either the amount of time of irradiation (temporal control) or by the intensity of light allowed to reach the surface. This new method will enable access to a wide range of polymer brush patterned surfaces and based on the simplicity of the process, will find use in a wide range of applications.

The spatial and temporal control of surface bound polymers may be extended to non-planar substrates such as spherical, disc-like and rod-like particles. This method may also be applied to the efficient fabrication of Janus particles. Further embodiments include the patterning of substrates with block copolymers, as well as fabrication of macromolecular structures through cross-linking of the brushes, followed by removal from the substrate.

Example 2

Relationship Between Polymer Brush Thickness and Polymerization Time

Figure 20:
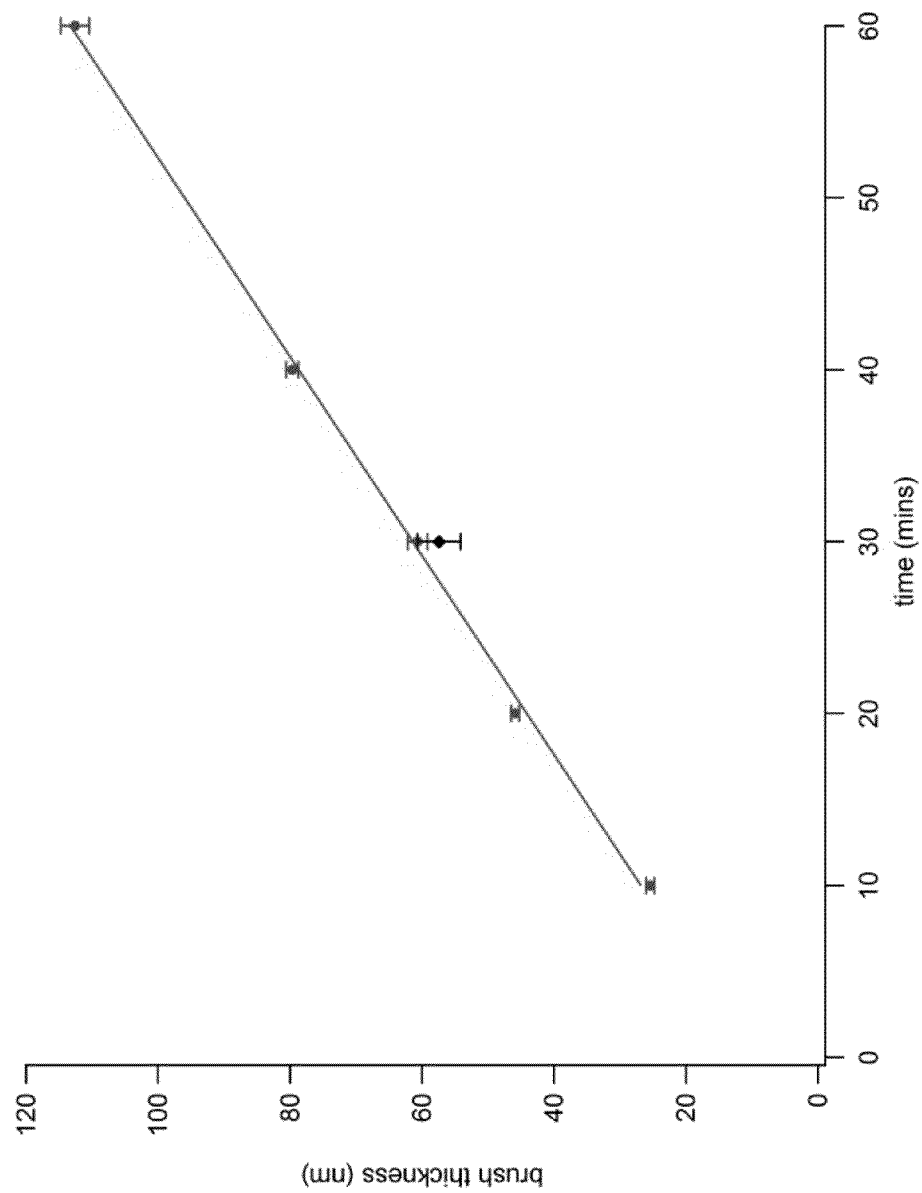
FIG. 20: graphed data showing brush thickness as a function of time. The data was collected from separate, but identical experiments and represents mean values from at least ten measurements per sample.

A relationship between polymer brush thickness and polymerization time is shown in FIG. 20. The linear relationship of film thickness with time suggests that control over the radical polymerization is maintained for surface initiated polymerizations. Furthermore, the black diamond data point in FIG. 20 represents an experiment in which the surface initiated polymerization was exposed to light for 10 minutes, dark for 10 minutes and then re-exposed to light for 20 minutes giving a total polymerization time of 30 minutes. The resulting brush layer thickness is in good agreement with the thickness resulting from a polymerization where the light is exposed continuously for 30 minutes. This experiment provides evidence that temporal control in surface initiated polymerizations is retained. It should be noted that no untethered or sacrificial initiator is added to any of these experiments.

Figure 21:
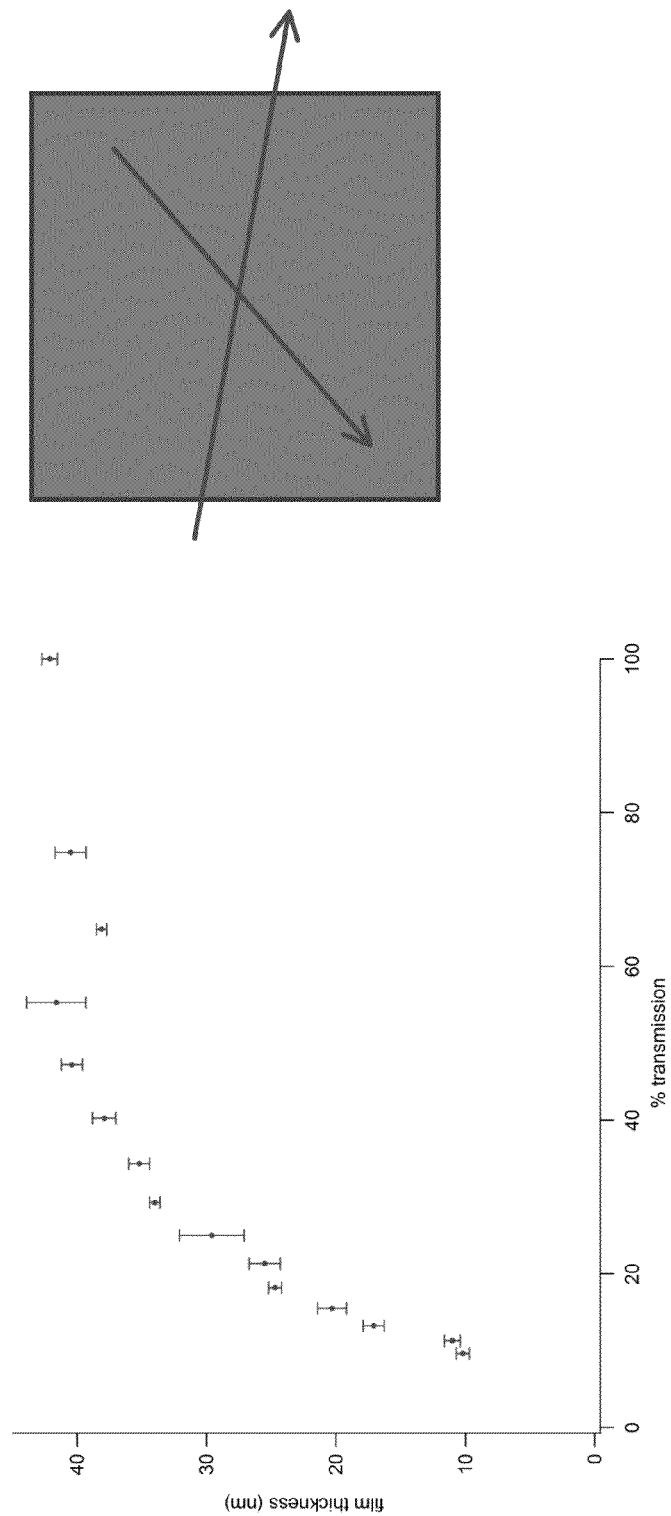
FIG. 21: graphed data showing film thickness measured by profilometry across both axes of a 100×100 μm patch patterned from a grayscale lithography mask. Each data point represents the average of the two measurements.
Figure 22:
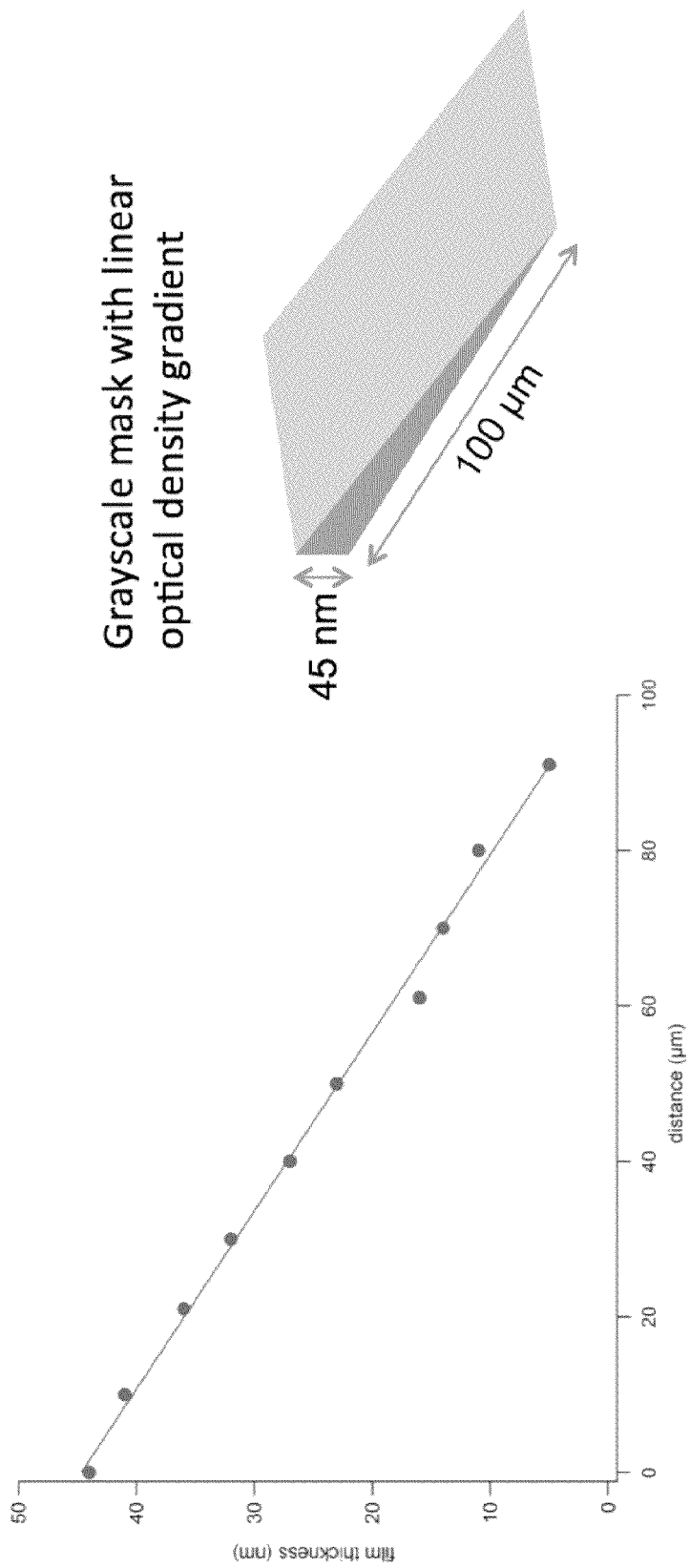
FIG. 22: graphed data and a grayscale mask diagram showing brush thickness versus distance along the grascale photomask with linear optical density gradient. Each data point represents the film thickness of a cross-section through the long axis of the gradient and was measured by profilometry every 10 micrometers.
Figure 23:
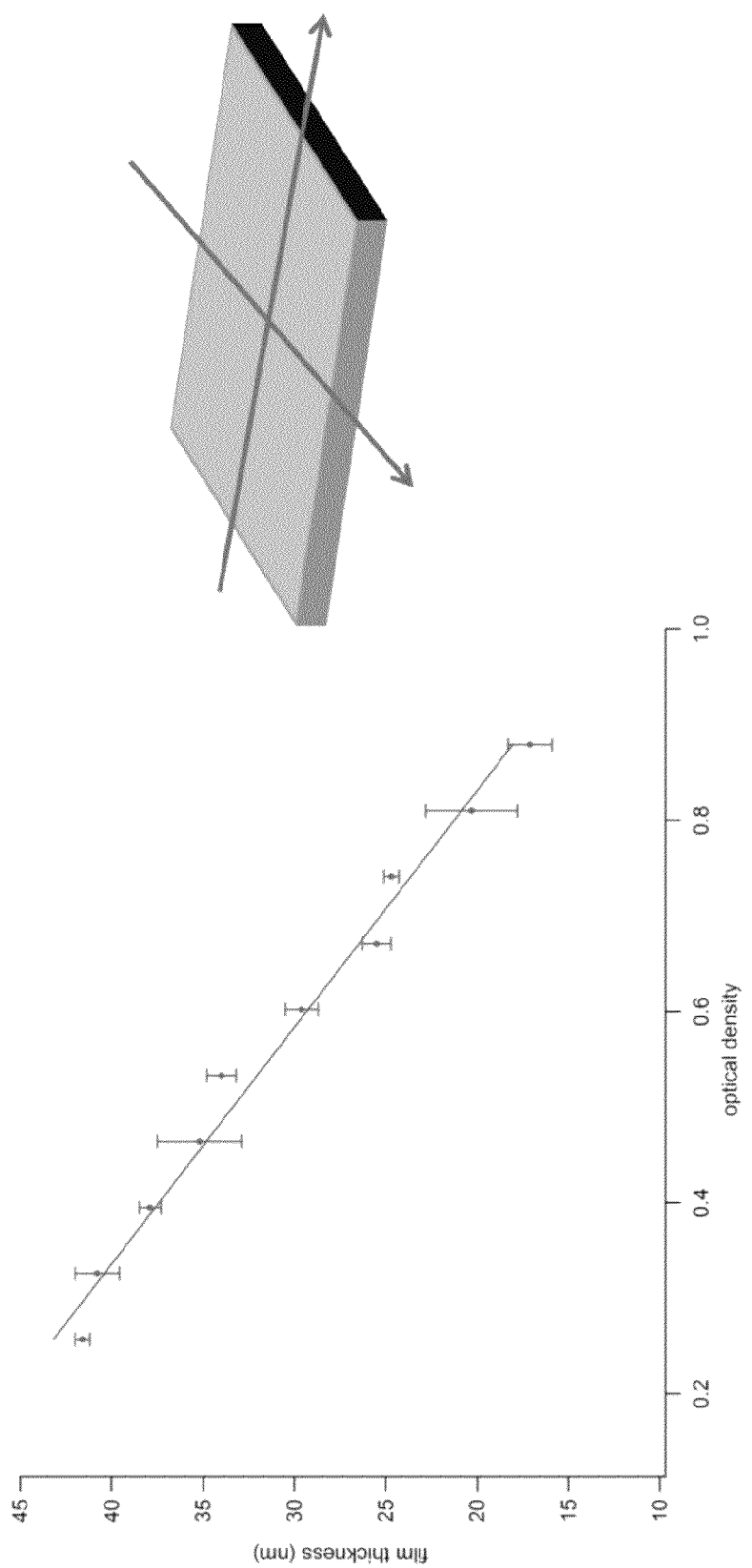
FIG. 23: graphed data showing brush thickness versus optical density using a grayscale mask that contains squares with varying optical density. Each data point represents the film thickness of a 100×100 micrometer square measured across both axes using profilometry.

Light intensity is observed to play a role with polymerization rate in polymerizations conducted in solution. For patterning applications, gradient brushes and more complex features can be patterned if the intensity of incident light can be modulated in a controlled fashion. FIG. 21 shows the measured film thickness versus transmission for a given polymerization time. A linear relationship exists between film thickness and the amount of light that reaches the substrate. In further support of this two additional grayscale photomasks were utilized. The first was a grayscale mask with linear optical density gradient. FIG. 22 shows the measured film thickness versus the distance along this mask. The second grayscale mask employed contained multiple squares with varying optical density. FIG. 23 shows the measured film thickness versus the optical density for the different squares on this mask. These two experiments further support that the film thickness obtained is proportional to the intensity of light that reaches the surface and demonstrates that three dimensional structures can be obtained through the use of grayscale masks with this photocontrolled polymerization process.

Figure 8:
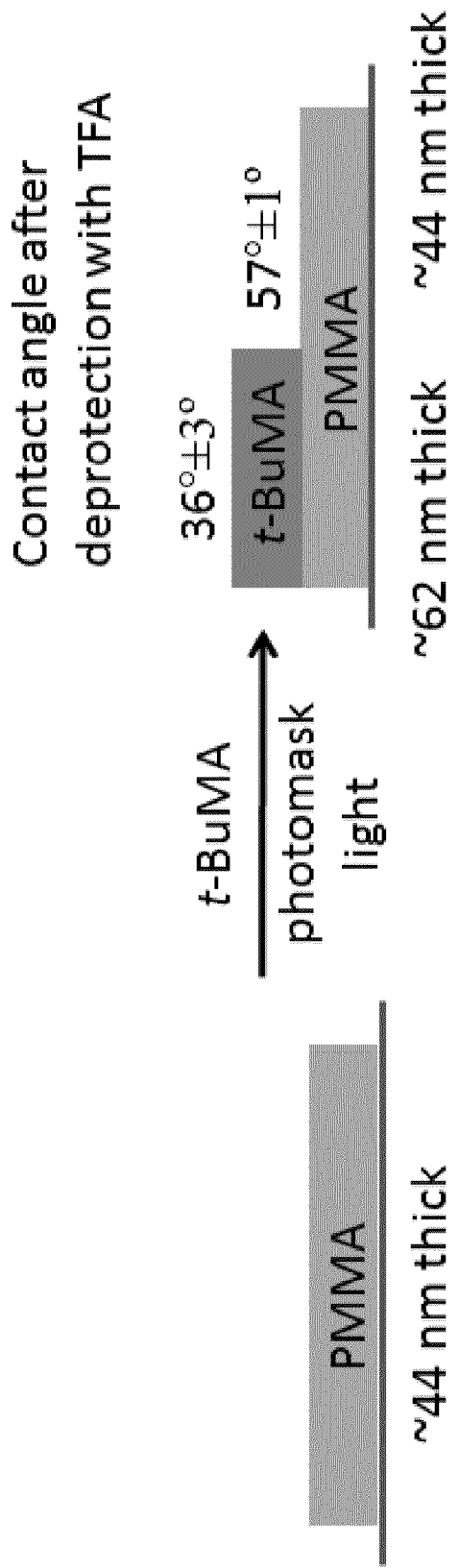
FIG. 8: a schematic of patterned poly(t-butyl methacrylate-b-methyl methacrylate) block copolymer brushes initiated from a PMMA initiating brush layer. After deprotection of t-BuMA, a structured polymer brush layer with well-defined hydrophilic and hydrophobic patches was produced.

Finally, one can fabricate block copolymer structures using visible light mediated polymerizations. FIG. 8 shows a schematic of a preliminary experiment in which a uniform PMMA brush layer with a thickness of ~44 nm was produced for the first block. The substrate was removed from the glove box, washed thoroughly, and reintroduced into the box for a second polymerization by reinitiation with tert-butyl methacrylate (t-BuMA). A photomask was used to cover one half of the substrate during the second polymerization. For the irradiated side of the substrate, a ~18 nm increase in film thickness was observed while the covered portion increased by less than 1 nm. The resulting block copolymer brush was immersed in trifluoroacetic acid and dichloromethane to hydrolyze the t-butyl esters. The static contact angle of the poly(methacrylic acid-b-methyl methacrylate) side of the wafer was found to be ~36° compared to ~57° for the PMMA side suggesting that a block copolymer brush had been patterned.

CONCLUSION

The instant disclosure successfully demonstrates spatial and temporal control over polymer chain growth from surface bound initiators using light. Utilizing a light-mediated controlled radical polymerization, brush growth can be achieved whenever the surface is irradiated, allowing for spatial control over chain growth. Furthermore, the film thickness (length of tethered polymers) can be controlled by varying the exposure time or intensity of light. These features allow for the facile patterning of substrates with tethered polymer chains.

This technique offers major advantages over current methods of patterning surfaces with polymer brushes. Since polymerization only occurs where light reaches the substrate, a uniformly functionalized substrate can be easily pattered with a traditional photomask. Furthermore, a photomask which can modulate the intensity of light can be used to pattern complex and arbitrary 3-dimensional structures.

The invention claimed is:

1. A method of forming a brush polymer comprising the steps of:
    (a) forming a plurality of polymer chains on a substrate; wherein:
        the polymer chains undergo a radical polymerization process that is reversibly activated in the presence of light and reversibly deactivated in the absence of light; and
        the polymer chains are formed from:
            an initiator that reacts with monomers in the radical polymerization process to form an intermediate compound capable of linking successively with the monomers to form the polymer chains;
            monomers that form polymer chain subunits in the radical polymerization process; and
            a photoredox catalyst; and
    (b) exposing the coating material to light so that the radical polymerization process is initiated, so that the brush polymer is formed.

2. The method of claim 1, wherein polymer chain lengths on a region of the substrate are controlled by:
    controlling an amount of time that the region is exposed to light; and/or
    controlling an intensity of light that reaches the region.

3. The method of claim 1, wherein the light that activates the radical polymerization process is passed through a filter that modulates the intensity of the light.

4. The method of claim 1, wherein a location of polymer chain formation on the substrate is controlled by:
    exposing to light: a first region on the substrate in which polymer chain growth is desired; and
    protecting from light exposure: a second region on the substrate in which polymer chain growth is not desired.

5. The method of claim 4, wherein different regions of the substrate are exposed to different amounts of light so as to form a three dimensional pattern on the substrate.

6. The method of claim 4, wherein the location of polymer chain formation and/or length of polymer chains on the substrate is controlled using a photomask that comprises a partially opaque plate having holes or transparencies that result in a defined pattern of light exposure on the substrate.

7. The method of claim 1, wherein the method comprises the sequential steps of:
    exposing a region of the coating material to light for a period of time so that the radical polymerization process is activated;
    protecting the region of the coating material from light exposure for a period of time so that the radical polymerization process is deactivated; and
    re-exposing the region of the coating material to light for a period of time so that the radical polymerization process is re-activated.

8. The method of claim 1, wherein the method comprises forming a substrate having the initiator uniformly distributed thereon.

9. The method of claim 1, wherein the method comprises exposing a region of the coating material to light so that the polymer chains in the region exhibit a polydispersity such that $M_w/M_n$ is between 1.0 and 2.0, wherein $M_w$=the weight average molecular weight of the plurality of polymer chains; and $M_n$=the number average molecular weight of the plurality of polymer chains.

10. The method of claim 1, wherein the initiator is covalently linked to the substrate prior to initiating the polymerization process.

11. A method of forming a brush polymer comprising the steps of:
    (a) forming a plurality of polymer chains on a substrate; wherein:
        the polymer chains undergo a radical polymerization process that is reversibly activated in the presence of light and reversibly deactivated in the absence of light; and
        the polymer chains are formed from:
            an initiator that reacts with monomers in the radical polymerization process to form an intermediate compound capable of linking successively with the monomers to form the polymer chains;
            monomers that form polymer chain subunits in the radical polymerization process; and
            a photoredox catalyst; and
    (b) exposing the coating material to light so that the radical polymerization process is initiated, so that the brush polymer is formed, wherein:
    polymer chain lengths on a region of the substrate are controlled by:
    controlling an amount of time that the region is exposed to light; and/or
    controlling an intensity of light that reaches the region; and
    the light that activates the radical polymerization process is passed through a filter that modulates the intensity of the light.

12. A method of forming a brush polymer comprising the steps of:
    (a) forming a plurality of polymer chains on a substrate; wherein:
        the polymer chains undergo a radical polymerization process that is reversibly activated in the presence of light and reversibly deactivated in the absence of light; and
        the polymer chains are formed from:
            an initiator that reacts with monomers in the radical polymerization process to form an intermediate compound capable of linking successively with the monomers to form the polymer chains;
            monomers that form polymer chain subunits in the radical polymerization process; and
            a photoredox catalyst; and
    (b) exposing the coating material to light so that the radical polymerization process is initiated, so that the brush polymer is formed, wherein:
    polymer chain lengths on a region of the substrate are controlled by:
    controlling an amount of time that the region is exposed to light; and/or
    controlling an intensity of light that reaches the region; and
    the method comprises exposing a region of the coating material to light so that the polymer chains in the region exhibit a polydispersity such that $M_w/M_n$ is between 1.0 and 2.0, wherein $M_w$=the weight average molecular weight of the plurality of polymer chains; and $M_n$=the number average molecular weight of the plurality of polymer chains.

* * * * *